(12) United States Patent
Dong et al.

(10) Patent No.: US 11,074,987 B2
(45) Date of Patent: Jul. 27, 2021

(54) SHIFT REGISTER, METHOD FOR DRIVING THE SAME, GATE DRIVE CIRCUITRY AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Ji Dong, Beijing (CN); Wenjun Xiao, Beijing (CN); Bo Feng, Beijing (CN); Xiaoxiao Chen, Beijing (CN); Haoliang Ji, Beijing (CN); Bingqing Yang, Beijing (CN); Shijun Wang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 97 days.

(21) Appl. No.: 16/428,400

(22) Filed: May 31, 2019

(65) Prior Publication Data
US 2020/0051655 A1 Feb. 13, 2020

(30) Foreign Application Priority Data
Aug. 8, 2018 (CN) .......................... 201821270340.6

(51) Int. Cl.
*G11C 19/00* (2006.01)
*G11C 19/28* (2006.01)
(Continued)

(52) U.S. Cl.
CPC ............. *G11C 19/287* (2013.01); *G09G 3/20* (2013.01); *G09G 3/3677* (2013.01); *G11C 19/28* (2013.01); *G09G 2300/0408* (2013.01); *G09G 2300/0426* (2013.01); *G09G 2310/0286* (2013.01); *G09G 2310/08* (2013.01)

(58) Field of Classification Search
None
See application file for complete search history.

(56) References Cited

U.S. PATENT DOCUMENTS 7,688,934 B2 * 3/2010 Tsai ........................ G11C 19/28
377/64
8,109,039 B2 * 2/2012 Kruger ................... B60J 5/0416
49/348

(Continued)

*Primary Examiner* — Tuan T Lam
(74) *Attorney, Agent, or Firm* — Brooks Kushman P.C.

(57) ABSTRACT

A shift register, a method for driving the same, a gate drive circuitry and a display apparatus are provided. The shift register includes: an input circuit, connected to a signal input terminal, a pull-up node and a first control terminal, and configured to provide a signal of the signal input terminal to the pull-up node under the control of the first control terminal; an output circuit, connected to the pull-up node, a first clock signal terminal and a signal output terminal, and configured to provide a signal of the first clock signal terminal to the signal output terminal under the control of the pull-up node; and a pull-up node control circuit, connected to the pull-up node, a second clock signal terminal, a third clock signal terminal and a first voltage terminal, and configured to provide a signal of the first voltage terminal to the pull-up node.

20 Claims, 11 Drawing Sheets

(51) Int. Cl.
  *G09G 3/20*     (2006.01)
  *G09G 3/36*     (2006.01)

(56) References Cited

U.S. PATENT DOCUMENTS

| | | | | |
|---|---|---|---|---|
| 8,396,183 B2* | 3/2013 | Yang | ............... | G09G 3/20 |
| | | | | 377/64 |
| 9,466,254 B2* | 10/2016 | Tan | ............... | G09G 3/3677 |
| 10,593,286 B2* | 3/2020 | Wu | ............... | G09G 3/20 |
| 2012/0155604 A1* | 6/2012 | Yang | ............... | G09G 3/3677 |
| | | | | 377/79 |
| 2016/0071614 A1* | 3/2016 | Lee | ............... | G11C 19/28 |
| | | | | 345/214 |
| 2016/0133337 A1* | 5/2016 | Gu | ............... | G09G 3/00 |
| | | | | 377/64 |
| 2016/0300623 A1* | 10/2016 | Yang | ............... | G11C 19/28 |
| 2019/0051365 A1* | 2/2019 | Li | ............... | G09G 3/20 |
| 2019/0129561 A1* | 5/2019 | Sun | ............... | G11C 19/28 |

\* cited by examiner

SHIFT REGISTER, METHOD FOR DRIVING THE SAME, GATE DRIVE CIRCUITRY AND DISPLAY APPARATUS

CROSS-REFERENCE TO RELATED APPLICATION

This application claims priority to Chinese Patent Application No. 201821270340.6 filed on Aug. 8, 2018, which is incorporated herein by reference in its entirety.

TECHNICAL FIELD

The present disclosure relates to the field of display technology, in particular to a shift register, a method for driving the same, a gate drive circuitry and a display apparatus.

BACKGROUND

In recent years, plate-panel displays, such as a thin film transistor liquid crystal display (Thin Film Transistor-Liquid Crystal Display, TFT-LCD) and an active matrix organic light emitting diode (Active Matrix Organic Light Emitting Diode, AMOLED) display panel, are widely used in electronic products such as televisions and cellphones due to advantages of light weight, small thickness and low power consumption.

With the development of technology, display panels with a high resolution and a narrow bezel become a trend of development, and a gate driver on array (Gate Driver on Array, GOA) technology comes into being accordingly. The GOA technology is by arranging a GOA circuit for driving gate lines at two sides of an effective display region of an array substrate in a display panel, where the GOA circuit includes multiple shift registers. The GOA circuit in related art has some disadvantages.

SUMMARY

In a first aspect, a shift register is provided according to some embodiments of the present disclosure, which includes an input circuit, an output circuit and a pull-up node control circuit, where the input circuit is connected to a signal input terminal, a pull-up node and a first control terminal, and is configured to provide a signal of the signal input terminal to the pull-up node under the control of the first control terminal;

the output circuit is connected to the pull-up node, a first clock signal terminal and a signal output terminal, and is configured to output a signal of the first clock signal terminal to the signal output terminal under the control of the pull-up node; and the pull-up node control circuit is connected to the pull-up node, a second clock signal terminal, a third clock signal terminal and a first voltage terminal, and is configured to provide a signal of the first voltage terminal to the pull-up node under the control of the second clock signal terminal and the third clock signal terminal.

In some optional embodiments, the shift register further includes: a reset circuit, connected to the pull-up node, a second control terminal, and a reset signal terminal, and configured to provide a signal of the reset signal terminal to the pull-up node under the control of the second control terminal.

In some optional embodiments, the shift register further includes: a pull-down node control circuit, connected to a first enabling terminal, the pull-up node, a pull-down node and the first voltage terminal, and configured to provide a signal of the first enabling terminal or the first voltage terminal to the pull-down node under the control of the first enabling terminal and the pull-up node.

In some optional embodiments, the shift register further includes: a noise reduction circuit, connected to the pull-down node, the pull-up node, the first voltage terminal and the signal output terminal, and configured, under the control of the pull-down node, to provide the signal of the first voltage terminal to the pull-up node and the signal output terminal during a display time period, to filter out noises from the pull-up node and the signal output terminal during the display time period.

In some optional embodiments, the shift register further includes: an output control circuit, connected to a second enabling terminal, the first voltage terminal and the signal output terminal, and configured to provide the signal of the first voltage terminal to the signal output terminal during a non-display time period under the control of the second enabling terminal, to filter out a noise from the signal output terminal during the non-display time period.

In some optional embodiments, the input circuit includes a first transistor, and the first transistor has a gate electrode connected to the first control terminal, a first electrode connected to the signal input terminal, and a second electrode connected to the pull-up node. The output circuit includes a capacitor and a second transistor, where the capacitor has a first terminal connected to the pull-up node and a second terminal connected to the signal output terminal, and the second transistor has a gate electrode connected to the pull-up node, a first electrode connected to the first clock signal terminal, and a second electrode connected to the signal output terminal.

In some optional embodiments, the pull-up node control circuit includes a third transistor and a fourth transistor, where the third transistor has a gate electrode connected to the second clock signal terminal, a first electrode connected to the pull-up node, and a second electrode connected to a first electrode of the fourth transistor, and the fourth transistor has a gate electrode connected to the third clock signal terminal, and a second electrode connected to the first voltage terminal.

In some optional embodiments, the reset circuit includes a fifth transistor, and the fifth transistor has a gate electrode connected to the second control terminal, a first electrode connected to the pull-up node, and a second electrode connected to the reset signal terminal.

In some optional embodiments, the pull-down node control circuit includes a sixth transistor, a seventh transistor, an eighth transistor, and a ninth transistor. The sixth transistor has a gate electrode and a first electrode both connected to the first enabling terminal, and a second electrode connected to a gate electrode of the seventh transistor, and the seventh transistor has a first electrode connected to the first enabling terminal, and a second electrode connected to the pull-down node. The eighth transistor has a gate electrode connected to the pull-up node, a first electrode connected to the pull-down node, and a second electrode connected to the first voltage terminal. The ninth transistor has a gate electrode connected to the pull-up node, a first electrode connected to the gate electrode of the seventh transistor, and a second electrode connected to the first voltage terminal.

In some optional embodiments, the noise reduction circuit includes a tenth transistor and an eleventh transistor, the tenth transistor has a gate electrode connected to the pull-down node, a first electrode connected to the pull-up node, and a second electrode connected to the first voltage terminal, and the eleventh transistor has a gate electrode connected to the pull-down node, a first electrode connected to the signal output terminal, and a second electrode connected to the first voltage terminal.

In some optional embodiments, the output control circuit includes a twelfth transistor, and the twelfth transistor has a gate electrode connected to the second enabling terminal, a first electrode connected to the signal output terminal, and a second electrode connected to the first voltage terminal.

In some optional embodiments, in a case that the first to the twelfth transistors are N-type thin film transistors, the first voltage terminal is a low level power supply terminal, and in a case that the first to the twelfth transistors are P-type thin film transistors, the first voltage terminal is a high level power supply terminal. Phases of the signals of the first clock signal terminal and the second clock signal terminal are inversed, and a signal of the third signal clock terminal is delayed by half a cycle with respect to the signal of the first signal clock terminal.

In a second aspect, a gate drive circuitry is further provided according to some embodiments of the present disclosure, which includes multiple cascaded shift registers according to the above first aspect and further includes a first initial signal terminal and a second initial signal terminal. A first stage of the shift registers includes a first control terminal and a signal input terminal both connected to the first initial signal terminal, a reset signal terminal connected to a signal output terminal of a second stage of the shift registers, and a second control terminal connected to a pull-up node of a third stage of the shift registers. The second stage of the shift registers includes a first control terminal connected to the second initial signal terminal, a signal input terminal connected to a signal output terminal of the first stage of the shift registers, a reset signal terminal connected to a signal output terminal of the third stage of the shift registers, and a second control terminal connected to a pull-up node of a fourth stage of the shift registers. An $(N+2)^{th}$ stage of the shift registers includes a first control terminal connected to a pull-up node of an $N^{th}$ stage of the shift registers, a signal input terminal connected to a signal output terminal of an $(N+1)^{th}$ stage of the shift registers, a reset signal terminal connected to a signal output terminal of an $(N+3)^{th}$ stage of the shift registers, and a second control terminal connected to a pull-up node of an $(N+4)^{th}$ stage of the shift registers, where N is a positive integer.

In some optional embodiments, the gate drive circuitry further includes a first clock terminal, a second clock terminal, a third clock terminal, a fourth clock terminal. In a case of $N=4i+1$, the $N^{th}$ stage of the shift registers has a first clock signal terminal connected to the first clock terminal, a second clock signal terminal connected to the second clock terminal, and a third clock signal terminal connected to a third clock terminal. In a case of $N=4i+2$, the $N^{th}$ stage of the shift registers has a first clock signal terminal connected to the second clock terminal, a second clock signal terminal connected to the third clock terminal, and a third clock signal terminal connected to the fourth clock terminal. In a case of $N=4i+3$, the $N^{th}$ stage of the shift registers has a first clock signal terminal connected to the third clock terminal, a second clock signal terminal connected to the fourth clock terminal, and a third clock signal terminal connected to the first clock terminal. In a case of $N=4i$, the $N^{th}$ stage of the shift registers has a first clock signal terminal connected to the fourth clock terminal, a second clock signal terminal connected to the first clock terminal, and a third clock signal terminal connected to the second clock terminal, where i is a positive integer.

In some optional embodiments, phases of signals of the first clock terminal and the second clock terminal are inversed, phases of signals of the third clock terminal and the fourth clock terminal are inversed, and the signal of the third clock terminal is delayed by half a cycle with respect to the signal of the first clock terminal.

In a third aspect, a display apparatus is further provided according to some embodiments of the present disclosure, which includes the gate drive circuitry according to the above second aspect and multiple gate lines, where the gate drive circuitry is configured to turn on or turn off the multiple gate lines.

In a fourth aspect, a method for driving a shift register is further provided according to some embodiments of the present disclosure, which is configured to drive the shift register according to the first aspect and includes:

providing a signal of the signal input terminal to the pull-up node in response to a signal of the first control terminal;

providing a signal of the first clock signal terminal to the signal output terminal under the control of a level of the pull-up node; and providing a signal of the first voltage terminal to the pull-up node in response to signals of the second clock signal terminal and the third clock signal terminal.

BRIEF DESCRIPTION OF THE DRAWINGS

In order to clarify the technical solutions according to the embodiments of the present disclosure or conventional art, the appended drawings involved in the description of the following embodiments are briefly introduced hereinafter. Apparently, the drawings only illustrate some embodiments of the present disclosure, and other drawings may be obtained based on these drawings by those skilled in the art without inventive efforts.

DETAILED DESCRIPTION

In order to clearly clarify the objective, technical solutions and advantages of the present disclosure, embodiments of the present disclosure are described in conjunction with the drawings. It is noted that the embodiments and the features of the embodiments of the present disclosure can be combined in arbitrary manners as long as they do not conflict with each other.

The steps illustrated in the flowchart of the drawings may be executed in a computer system through a set of computer executable instructions. Also, although logical sequences are shown in the flowchart, in some cases the steps shown or described may be performed in a different order than the one described herein.

Those skilled in the art would well appreciate that transistors according to all embodiments of the present disclosure may be thin film transistors, field-effect transistors or other components with same properties. Optionally, the thin film transistors according to some embodiments of the present disclosure may be oxide semiconductor transistors. As a source and a drain of a transistor employed herein are symmetric, the source and the drain are interchangeable. In the embodiments of the present disclosure, in order to distinguish two electrodes of a transistor other than a gate electrode thereof, one of the two electrodes is referred to as a first electrode and the other is referred to as a second electrode, where the first electrode may be a source, and the second electrode may be a drain; or the first electrode may be a drain, and the second electrode may be a source.

It is found out by the inventor through researches that some transistors of a GOA circuit in related art are in a long-term biased state during forward scanning, and in high temperature and high humidity environments, the bias voltage may easily result in shift of transistor properties and thereby lead to abnormality in backward scanning of the GOA circuit, which reduces operation stability, usage reliability and display effects of a display panel.

Figure 1:
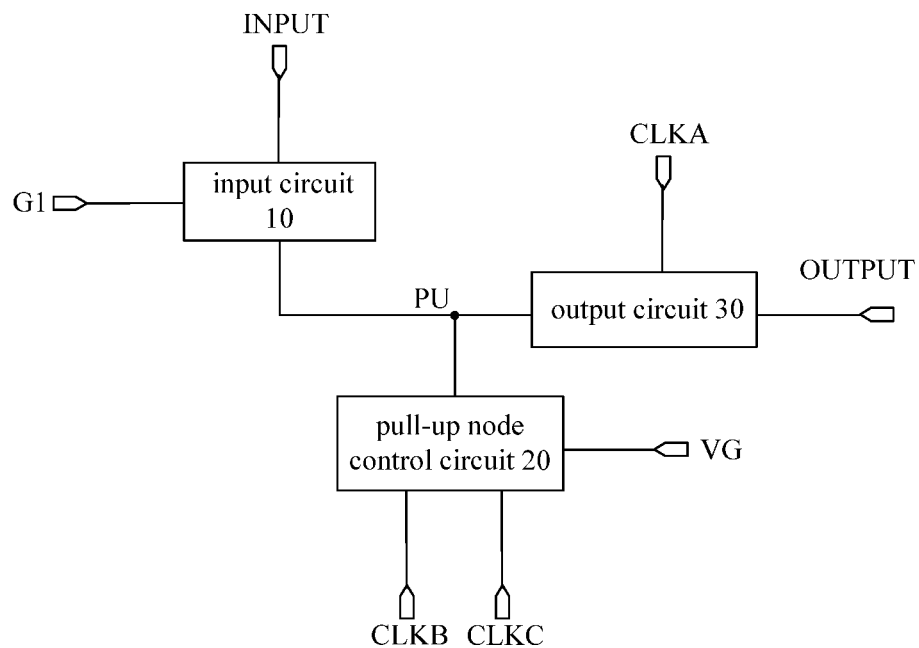
FIG. 1 is a schematic diagram of a shift register according to an embodiment of the present disclosure.

FIG. 1 is a schematic diagram of a shift register according to an embodiment of the present disclosure. As shown in FIG. 1, the shift register according to the embodiment of the present disclosure includes an input circuit 10, an output circuit 30 and a pull-up node control circuit 20.

Specifically, the input circuit 10 is connected to a signal input terminal INPUT, a pull-up node PU and a first control terminal G1, and is configured to provide a signal of the signal input terminal INPUT to the pull-up node PU under the control of the first control terminal G1. The output circuit 30 is connected to the pull-up node PU, a first clock signal terminal CLKA and a signal output terminal OUTPUT, and is configured to provide a signal of the first clock signal terminal CLKA to the signal output terminal OUTPUT under the control of the pull-up node PU. The pull-up node control circuit 20 is connected to the pull-up node PU, a second clock signal terminal CLKB, a third clock signal terminal CLKC and a first voltage terminal VG, and is configured to provide a signal of the first voltage terminal VG to the pull-up node PU under the control of the second clock signal terminal CLKB and the third clock signal terminal CLKC.

The signal output terminal OUTPUT provides gate electrode drive signals for a current shift register, and provides a signal for a signal input terminal INPUT of a next stage of shift register.

The signal inputted by the signal input terminal INPUT is a pulse signal, the signal outputted by the signal output terminal OUTPUT is a pulse signal, the first voltage terminal VG continuously provides a first voltage, the signal inputted by the first control terminal G1 is a pulse signal, and signals of the first clock signal terminal CLKA, the second clock signal terminal CLKB and the third clock signal terminal CLKC are periodic signals.

Specifically, a first control terminal G1 of a first stage of shift register is connected to a first initial signal terminal, a first control terminal G1 of a second stage of shift register is connected to a second initial signal terminal, and a first control terminal G1 of an $N^{th}$ stage of shift register is connected to a pull-up node PU of an $(N-2)^{th}$ stage of shift register.

The shift register according to the embodiment of the present disclosure includes: an input circuit, connected to a signal input terminal, a pull-up node and a first control terminal, and configured to provide a signal of the signal input terminal to the pull-up node under the control of the first control terminal; an output circuit, connected to the pull-up node, a first clock signal terminal and a signal output terminal, and configured to provide a signal of the first clock signal terminal to the signal output terminal under the control of the pull-up node; a pull-up node control circuit, connected to the pull-up node, a second clock signal terminal, a third clock signal terminal and a first voltage terminal, and configured to provide a signal of the first voltage terminal to the pull-up node under the control of the second clock signal terminal and the third clock signal terminal. In the embodiment of the present disclosure, the input circuit is connected to the signal input terminal and the first control terminal, thereby reducing the time during which transistors in the input circuit is biased, and relieving shift of properties of thin film transistors caused by the bias of a direct current voltage on the transistors in an input circuit in conventional technology. In the embodiment, the pull-up node control circuit controls the pull-up node by using the signals from the second clock signal terminal and the third clock signal terminal, thereby reducing the time during which the pull-up node is at a high level, and thus reducing the time during which the transistors in the input circuit is biased. In this way, shift of transistor properties due to the bias voltage in environments of high temperature and high humidity can be avoided in a display panel, which ensures normal backward scanning of the display panel and improves operation stability, reliability of use and display effects of the display panel.

Figure 2:
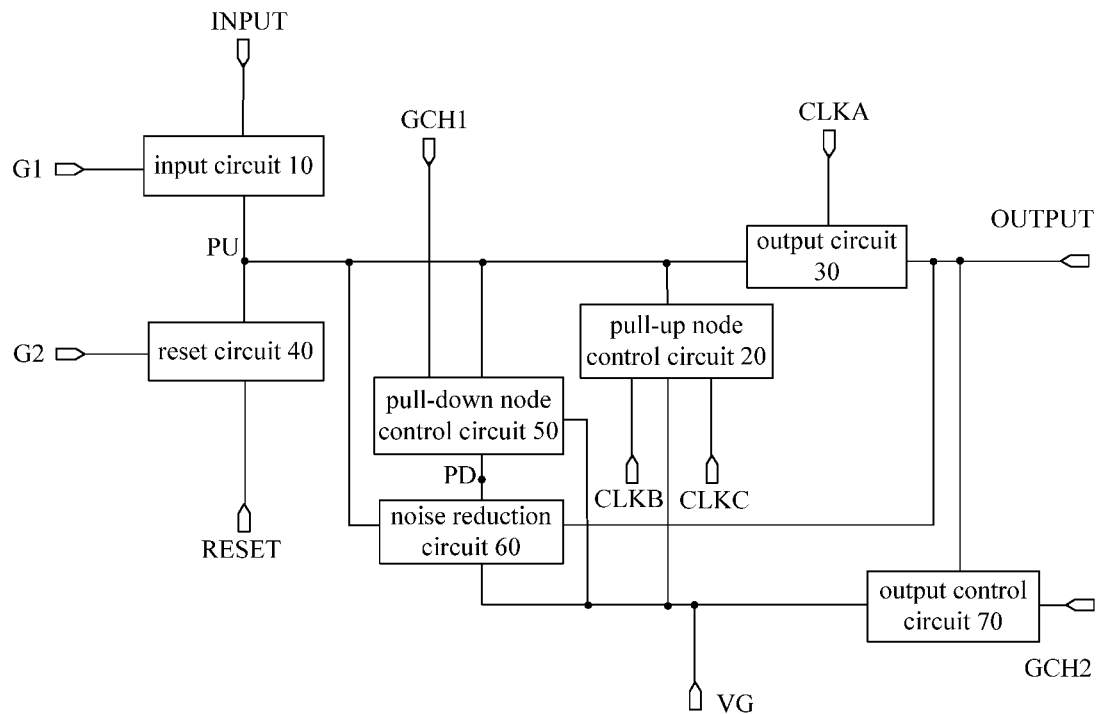
FIG. 2 is a schematic diagram of a shift register according to an embodiment of the present disclosure.

FIG. 2 is a schematic diagram of a shift register according to some optional embodiments of the present disclosure. As shown in FIG. 2, the shift register according to an embodiment of the present disclosure further includes a reset circuit 40. The reset circuit 40 is connected to the pull-up node PU, a second control terminal G2 and a reset signal terminal RESET, and is configured to provide a signal of the reset signal terminal RESET to the pull-up node under the control of the second control terminal G2.

A signal of the second control terminal G2 is a pulse signal, a second control terminal G2 of an $N^{th}$ stage of shift register is connected to a pull-up node of an $(N+2)^{th}$ stage of shift register, and a reset signal terminal RESET of the $N^{th}$ stage of shift register is connected to a signal output terminal OUTPUT of an $(N+1)^{th}$ stage of shift register.

The reset circuit according to the embodiment of the present disclosure reduces the time during which the transistors in the input circuit is biased, relieves shift of properties of thin film transistors caused by the bias of a direct current voltage on the transistors in a reset circuit in related art, thereby ensuring normal backward scanning of a display panel and improving operation stability, reliability of use and display effects of the display panel.

In the embodiment of the present disclosure, by providing a reset circuit in the shift register, a level of the pull-up node can be lowered under the control of the second control terminal, and noises in the shift register can be reduced, thereby further improving operation stability, reliability of use and display effects of the display panel.

Optionally, as shown in FIG. 2, the shift register according to an embodiment of the present disclosure further includes a pull-down node control circuit 50, a noise reduction circuit 60 and an output control circuit 70.

Specifically, the pull-down node control circuit 50 is connected to a first enabling terminal GCH1, the pull-up node PU, a pull-down node PD and the first voltage terminal VG, and is configured to provide a signal of the first enabling terminal GCH1 or the first voltage terminal VG to the pull-down node PD under the control of the first enabling terminal GCH1 and the pull-up node PU. The noise reduction circuit 60 is connected to the pull-down node PD, the pull-up node PU, the first voltage terminal VG and the signal output terminal OUTPUT, and is configured, under the control of the pull-down node PD, to provide a signal of the first voltage terminal VG to the pull-up node PU and the signal output terminal OUTPUT respectively, to filter out noises from the pull-up node PU and the signal output terminal OUTPUT. The output control circuit 70 is connected to a second enabling terminal GCH2, the first voltage terminal VG and the signal output terminal OUTPUT, and is configured to provide a signal of the first voltage terminal VG to the signal output terminal OUTPUT under the control of the second enabling terminal GCH2, to filter out noises from the signal output terminal OUTPUT.

A signal of the first enabling terminal GCH1 is an input signal of the pull-down node PD, which is a frame enabling signal. Specifically, an input signal of the first enabling terminal GCH1 is a turning-on signal within a display frame and is a turning-off signal beyond a display frame, and an input signal of the second enabling signal GCH2 is a turning-on signal beyond a display frame and is a turning-off signal within a display frame.

In the embodiment of the present disclosure, noises in the shift register can be reduced by the pull-down node control circuit and the noise reduction circuit cooperating with each other, thereby further improving operation stability, reliability of use and display effects of the display panel.

Figure 3:
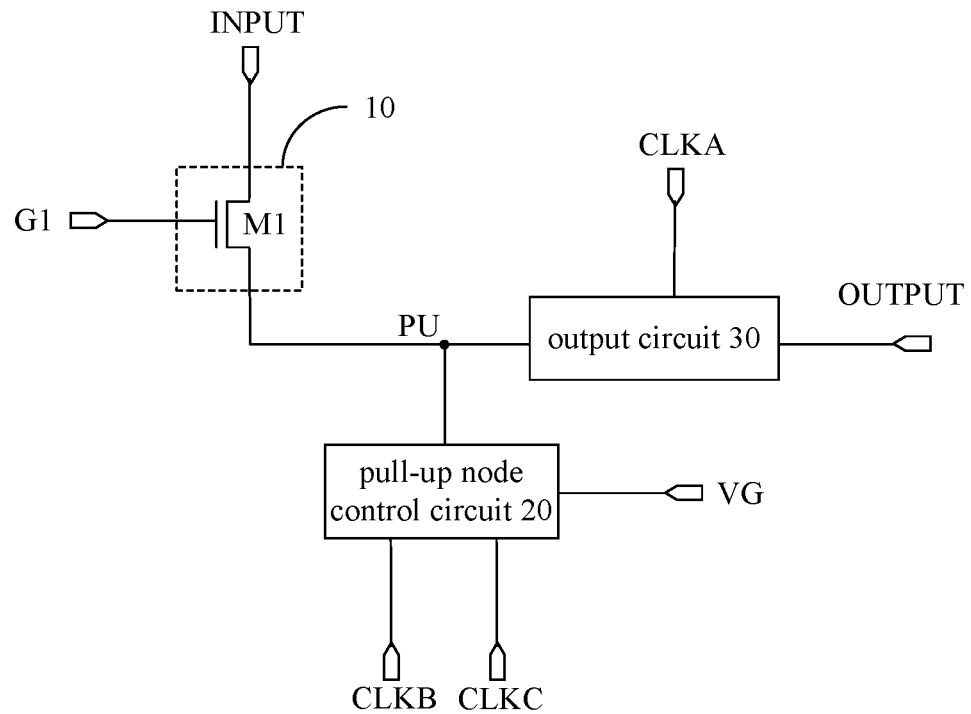
FIG. 3 is a schematic diagram of a shift register according to an embodiment of the present disclosure.

FIG. 3 is a schematic diagram of a shift register according to an embodiment of the present disclosure. Optionally, as shown in FIG. 3, the input circuit 10 in the shift register according to the embodiment of the present disclosure includes a first transistor M1.

Specifically, the first transistor M1 has a gate electrode connected to the first control terminal G1, a first electrode connected to the signal input terminal INPUT, and a second electrode connected to the pull-up node PU.

FIG. 3 shows an exemplary structure of the input circuit according to the embodiment. Those skilled in the art would well appreciate that the input circuit is not limited thereto, as long as it can provide the signal of the signal input terminal to the pull-up node.

Figure 4:
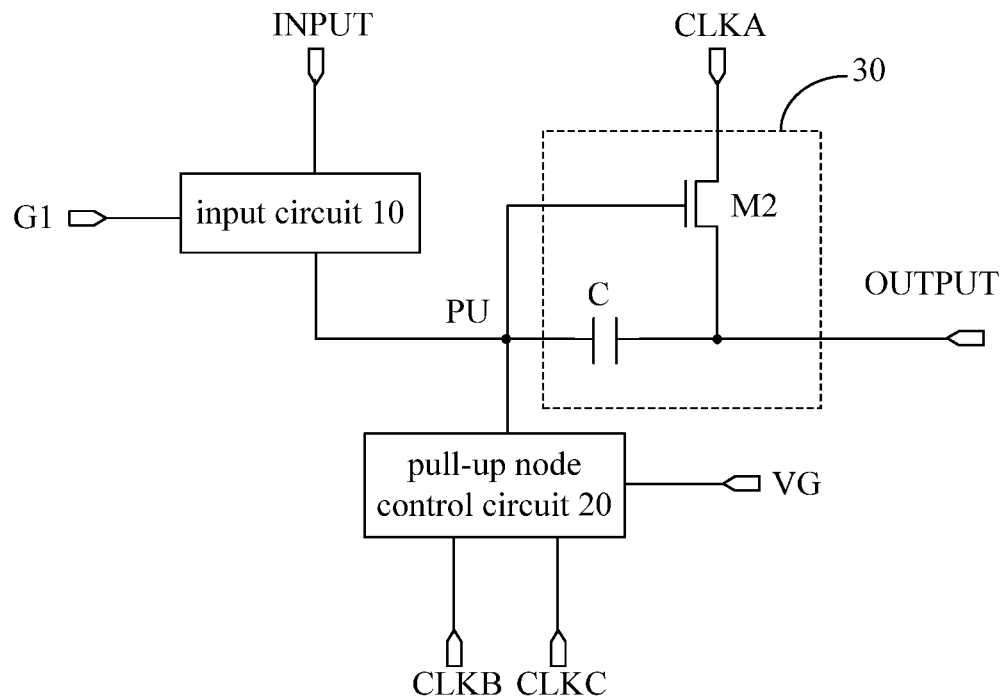
FIG. 4 is a schematic diagram of a shift register according to an embodiment of the present disclosure.

FIG. 4 is a circuit diagram of an output circuit according to an embodiment of the present disclosure. Optionally, as shown in FIG. 4, the output circuit 30 in the shift register according to the embodiment of the present disclosure includes a capacitor C and a second transistor M2.

Specifically, the capacitor C has a first terminal connected to the pull-up node PU and a second terminal connected to the signal output terminal OUTPUT; and the second transistor M2 has a gate electrode connected to the pull-up node PU, a first electrode connected to the first clock signal terminal CLKA, and a second electrode connected to the signal output terminal OUTPUT.

Optionally, the capacitor C may be a liquid crystal capacitor formed by a pixel electrode and a common electrode, or an equivalent capacitor of a liquid crystal capacitor formed by a pixel electrode and a common electrode and a storage capacitor.

FIG. 4 shows an exemplary structure of the output circuit according to the embodiment. Those skilled in the art would well appreciate that the output circuit is not limited thereto, as long as it can provide the signal of the first clock signal terminal to the signal output terminal.

Figure 5:
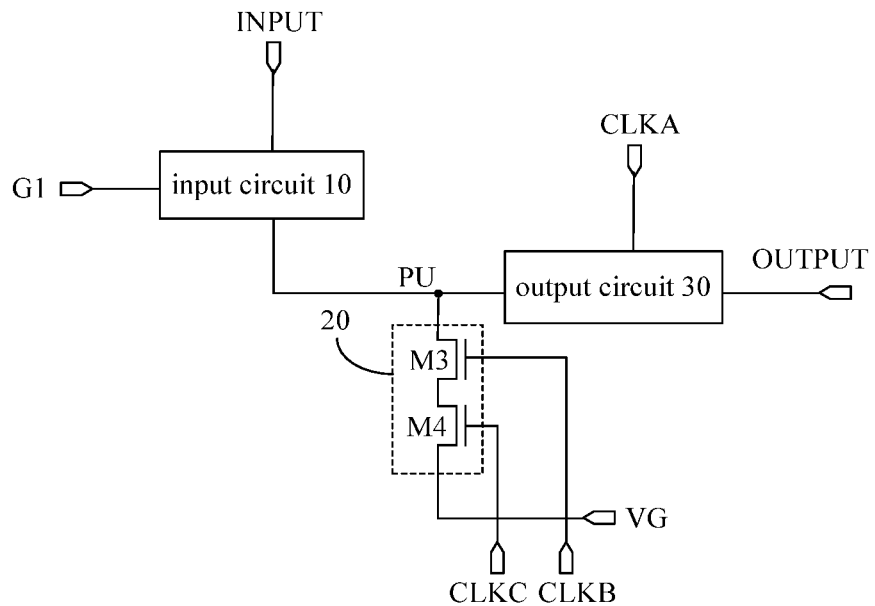
FIG. 5 is a schematic diagram of a shift register according to an embodiment of the present disclosure.

FIG. 5 is a circuit diagram of a pull-up node control circuit according to an embodiment of the present disclosure. Optionally, as shown in FIG. 5, the pull-up node control circuit 20 in the shift register according to the embodiment of the present disclosure includes a third transistor M3 and a fourth transistor M4.

Specifically, the third transistor M3 has a gate electrode connected to the second clock signal terminal CLKB, a first electrode connected to the pull-up node PU, and a second electrode connected to a first electrode of the fourth transistor M4. The fourth transistor M4 has a gate electrode connected to the third clock signal terminal CLKC, and a second electrode connected to the first voltage terminal VG.

FIG. 5 shows an exemplary structure of the pull-up node control circuit according to the embodiment. Those skilled in the art would well appreciate that the pull-up node control circuit is not limited thereto, as long as it can provide the signal of the first voltage terminal VG to the pull-up node PU.

Figure 6:
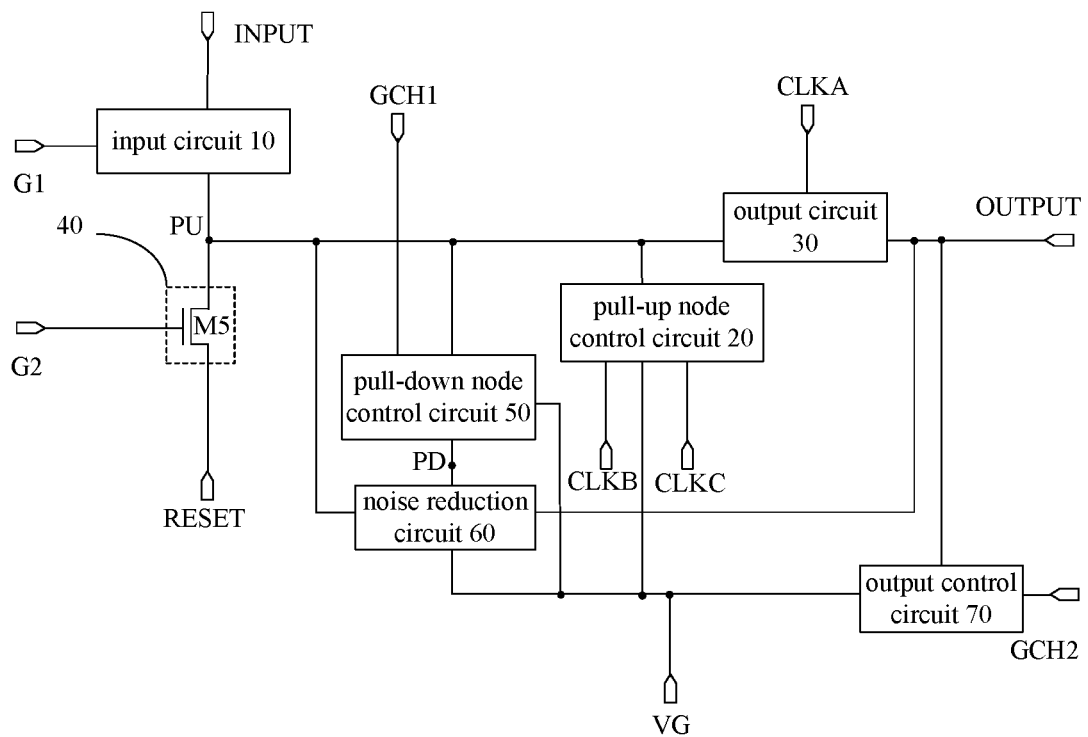
FIG. 6 is a schematic diagram of a shift register according to an embodiment of the present disclosure.

FIG. 6 is a circuit diagram of a reset circuit according to an embodiment of the present disclosure. Optionally, as shown in FIG. 6, the reset circuit 40 in the shift register of the embodiment of the present disclosure includes a fifth transistor M5.

Specifically, the fifth transistor M5 has a gate electrode connected to the second control terminal G2, a first electrode connected to the pull-up node PU, and a second electrode connected to the reset signal terminal RESET.

FIG. 6 shows an exemplary structure of the reset circuit according to the embodiment. Those skilled in the art would well appreciate that the reset circuit is not limited thereto, as long as it can provide the signal of the reset signal terminal RESET to the pull-up node PU.

Figure 7:
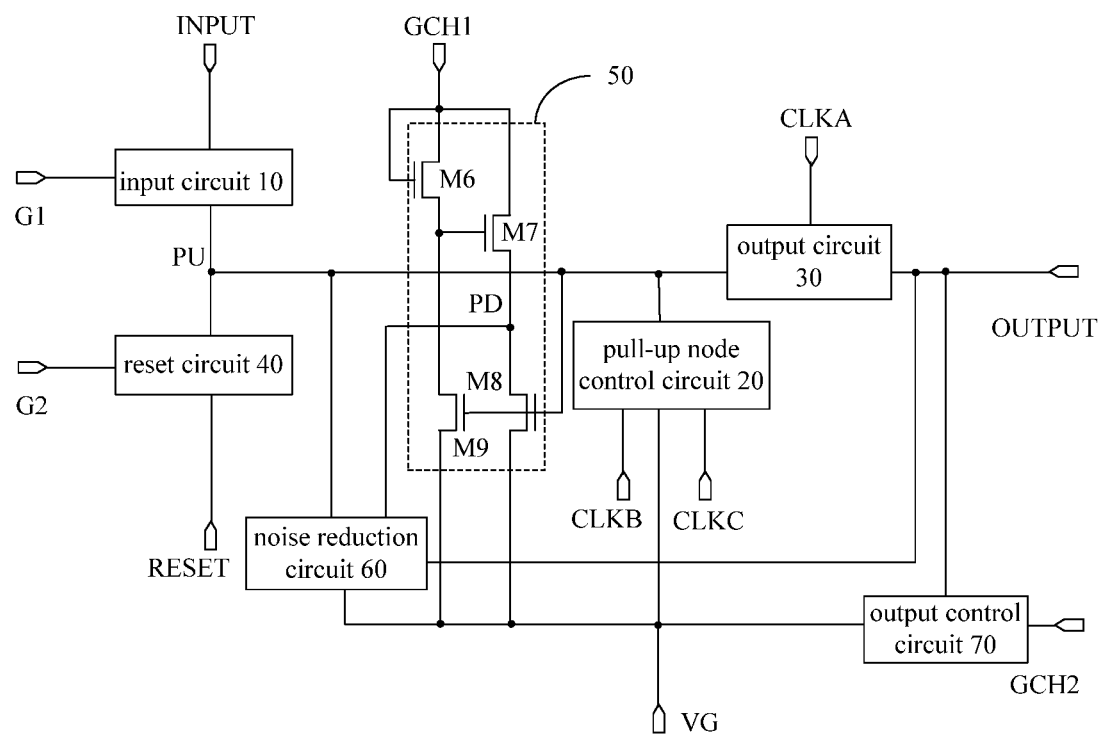
FIG. 7 is a schematic diagram of a shift register according to an embodiment of the present disclosure.

FIG. 7 is a circuit diagram of a pull-down node control circuit according to an embodiment of the present disclosure. Optionally, as shown in FIG. 7, the pull-down node control circuit 50 in the shift register according to the embodiment of the present disclosure includes a sixth transistor M6, a seventh transistor M7, an eighth transistor M8, and a ninth transistor M9.

Specifically, the sixth transistor M6 has a gate electrode and a first electrode both connected to the first enabling terminal GCH1, and a second electrode connected to a gate electrode of the seventh transistor M7. The seventh transistor M7 has a first electrode connected to the first enabling terminal GCH1, and a second electrode connected to the pull-down node PD. The eighth transistor M8 has a gate electrode connected to the pull-up node PU, a first electrode connected to the pull-down node PD, and a second electrode connected to the first voltage terminal VG. The ninth transistor M9 has a gate electrode connected to the pull-up node PU, a first electrode connected to the gate electrode of the seventh transistor M7, and a second electrode connected to the first voltage terminal VG.

FIG. 7 shows an exemplary structure of the pull-down node control circuit according to the embodiment. Those skilled in the art would well appreciate that the pull-down node control circuit is not limited thereto, as long as it can provide the signal of the first enabling terminal GCH1 or the first voltage terminal VG to the pull-down node PD.

Figure 8:
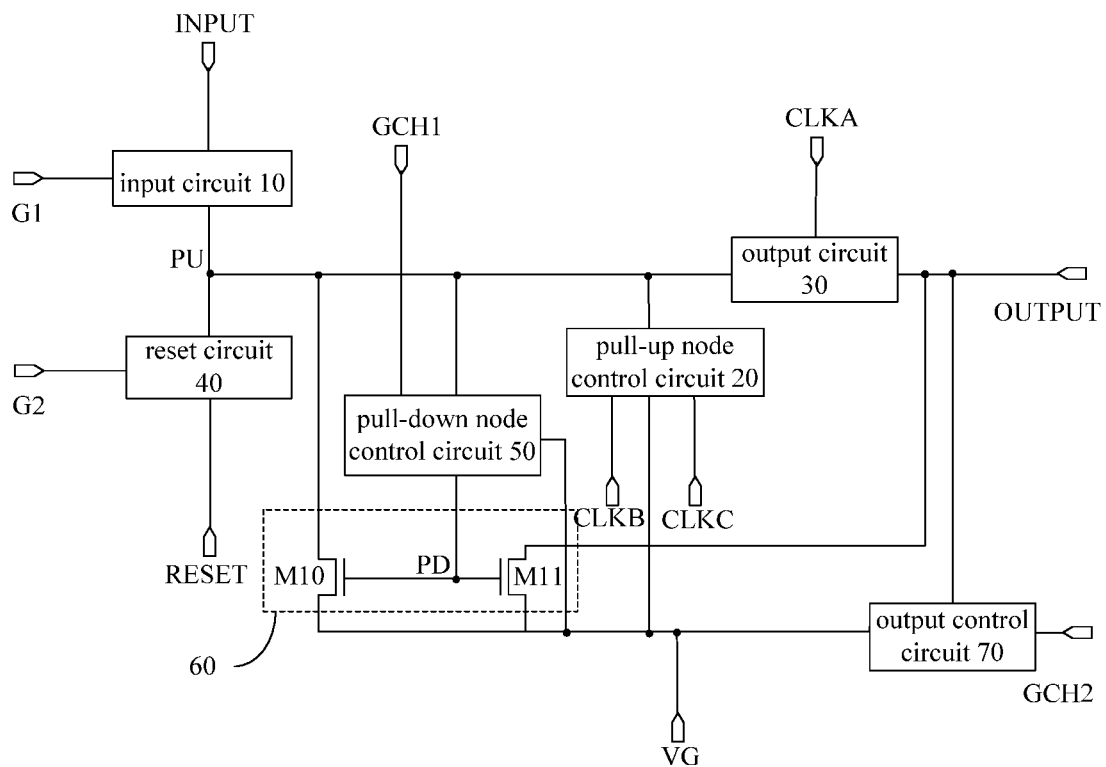
FIG. 8 is a schematic diagram of a shift register according to an embodiment of the present disclosure.

FIG. 8 is a circuit diagram of a noise reduction circuit according to an embodiment of the present disclosure. Optionally, as shown in FIG. 8, the noise reduction circuit 60 in the shift register according to the embodiment of the present disclosure includes a tenth transistor M10 and an eleventh transistor M11.

Specifically, the tenth transistor M10 has a gate electrode connected to the pull-down node PD, a first electrode connected to the pull-up node PU, and a second electrode connected to the first voltage terminal VG, and the eleventh transistor M11 has a gate electrode connected to the pull-down node PD, a first electrode connected to the signal output terminal OUTPUT, and a second electrode connected to the first voltage terminal VG.

FIG. 8 shows an exemplary structure of the noise reduction circuit according to the embodiment. Those skilled in the art would well appreciate that the noise reduction circuit is not limited thereto, as long as it can provide the signal of the first voltage terminal VG to the pull-up node PU and the signal output terminal OUTPUT.

Figure 9:
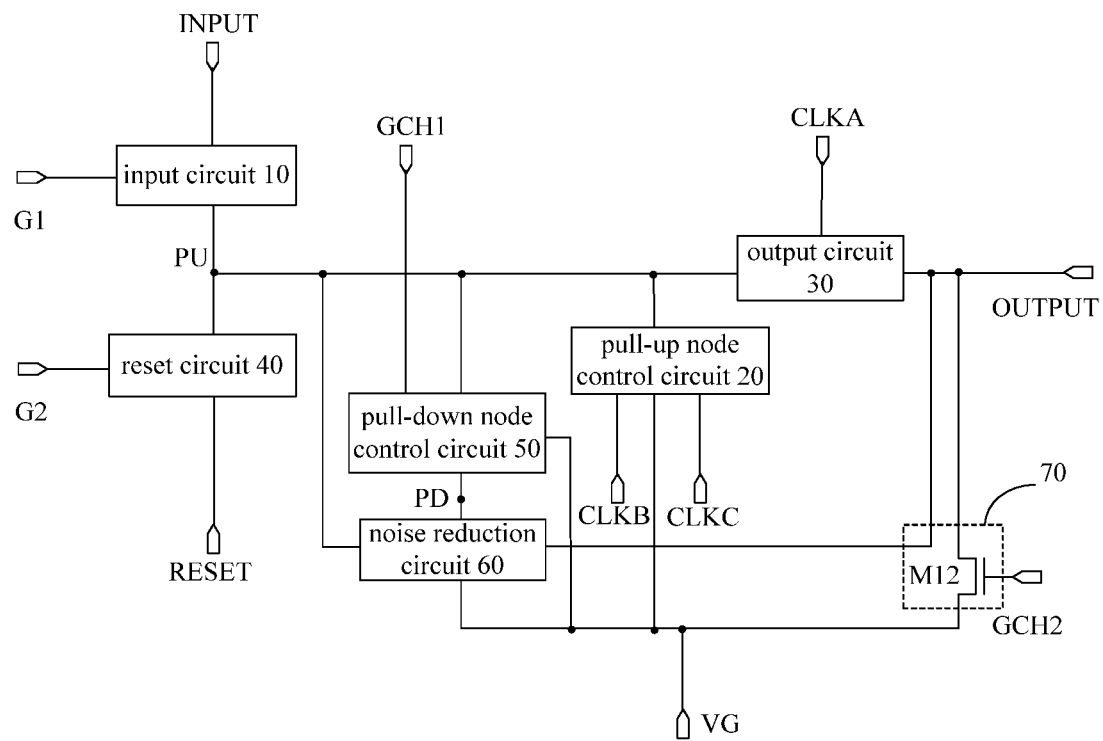
FIG. 9 is a schematic diagram of a shift register according to an embodiment of the present disclosure.

FIG. 9 is a circuit diagram of an output control circuit according to an embodiment of the present disclosure. Optionally, as shown in FIG. 9, the output control circuit 70 in the shift register according to the embodiment of the present disclosure includes a twelfth transistor M12.

Specifically, the twelfth transistor M12 has a gate electrode connected to the second enabling terminal GCH2, a first electrode connected to the signal output terminal OUTPUT, and a second electrode connected to the first voltage terminal VG.

FIG. 9 shows an exemplary structure of the output control circuit according to the embodiment. Those skilled in the art would well appreciate that the output control circuit is not limited thereto, as long as it can provide the signal of the first voltage terminal VG to the signal output terminal OUTPUT.

Figure 10:
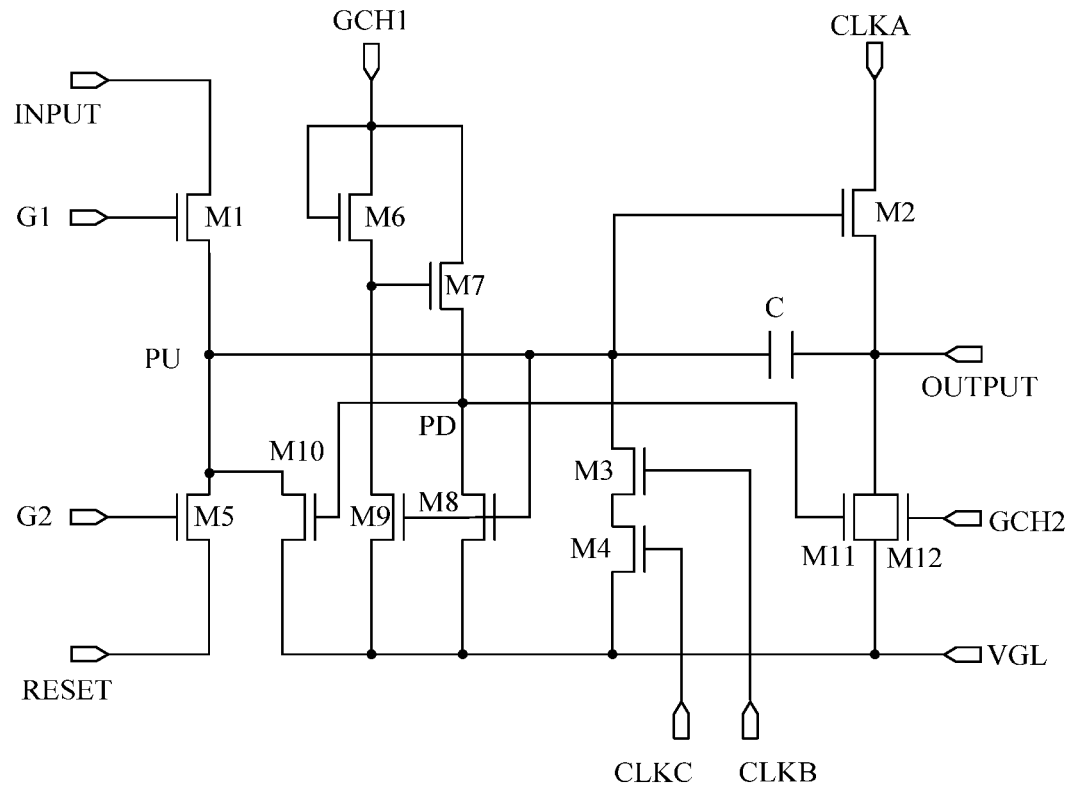
FIG. 10 is a schematic circuit diagram of a shift register according to an embodiment of the present disclosure.

FIG. 10 is a circuit diagram of a shift register according to an optional embodiment of the present disclosure. The shift register according to the embodiment of the present disclosure includes an input circuit 10, an output circuit 30, a pull-up node control circuit 20, a reset circuit 40, a pull-down node control circuit 50, a noise reduction circuit 60 and an output control circuit 70.

The input circuit 10 includes a first transistor M1; the output circuit 30 includes a capacitor C and a second transistor M2; the pull-up node control circuit 20 includes a third transistor M3 and a fourth transistor M4; the reset circuit 40 includes a fifth transistor M5; the pull-down node control circuit 50 includes a sixth transistor M6, a seventh transistor M7, an eighth transistor M8 and a ninth transistor M9; the noise reduction circuit 60 includes a tenth transistor M10 and an eleventh transistor M11; and the output control circuit 70 includes a twelfth transistor M12.

Specifically, the first transistor M1 has a gate electrode connected to a first control terminal G1, a first electrode connected to a signal input terminal INPUT, and a second electrode connected to a pull-up node PU. The capacitor C has a first terminal connected to the pull-up node PU and a second terminal connected to a signal output terminal OUTPUT; and the second transistor M2 has a gate electrode connected to the pull-up node PU, a first electrode connected to a first clock signal terminal CLKA, and a second electrode connected to the signal output terminal OUTPUT. The third transistor M3 has a gate electrode connected to a second clock signal terminal CLKB, a first electrode connected to the pull-up node PU, and a second electrode connected to a first electrode of the fourth transistor M4, and the fourth transistor M4 has a gate electrode connected to a third clock signal terminal CLKC, and a second electrode connected to a low level power supply terminal VGL. The fifth transistor M5 has a gate electrode connected to a second control terminal G2, a first electrode connected to the pull-up node PU, and a second electrode connected to a reset signal terminal RESET. The sixth transistor M6 has a gate electrode and a first electrode both connected to a first enabling terminal GCH1, and a second electrode connected to a gate electrode of the seventh transistor M7. The seventh transistor M7 has a first electrode connected to the first enabling terminal GCH1, and a second electrode connected to a pull-down node PD. The eighth transistor M8 has a gate electrode connected to the pull-up node PU, a first electrode connected to the pull-down node PD, and a second electrode connected to the low level power supply terminal VGL. The ninth transistor M9 has a gate electrode connected to the pull-up node PU, a first electrode connected to the gate electrode of the seventh transistor M7, and a second electrode connected to the low level power supply terminal VGL. The tenth transistor M10 has a gate electrode connected to the pull-down node PD, a first electrode connected to the pull-up node PU, and a second electrode connected to the low level power supply terminal VGL, and the eleventh transistor M11 has a gate electrode connected to the pull-down node PD, a first electrode connected to the signal output terminal OUTPUT, and a second electrode connected to the low level power supply terminal VGL. The twelfth transistor M12 has a gate electrode connected to a second enabling terminal GCH2, a first electrode connected to the signal output terminal OUTPUT, and a second electrode connected to the low level power supply terminal VGL.

The exemplary structures of the input circuit, the output circuit, the pull-up node control circuit, the reset circuit, the pull-down node circuit, the noise reduction circuit and the output control circuit are described in the above embodiment. Those skilled in the art would well appreciate that the circuits listed above are not limited thereto, as long as they can perform their respective functions.

In the embodiment as shown in FIG. 10, the transistors M1 to M12 are all N-type thin film transistors, and the first voltage terminal VG is a low level power supply terminal VGL. In other optional embodiments, the transistors M1 to M12 may be all P-type thin film transistors, and in this case, it is only necessary to set the first voltage terminal VG to a high level power supply terminal and reverse phases of signals of the nine signal input terminals INPUT, RESET, GCH1, GCH2, CLKA, CLKB, CLKC, G1 and G2.

By providing either N-type or P-type thin film transistors as all the transistors M1 to M12, the manufacture process can be unified and manufacture steps can be reduced, thereby improving a product yield. Moreover, considering that a low temperature polysilicon thin film transistor has a small leakage current, the transistors according to the embodiments of the present disclosure may all be low temperature polysilicon thin film transistors, and the thin film transistors may be bottom gate electrode or top gate electrode thin film transistors, as long as they can implement switching functions.

The technical solutions according to the embodiments of the present disclosure are further clarified with reference to an operating process of the shift register.

Figure 11:
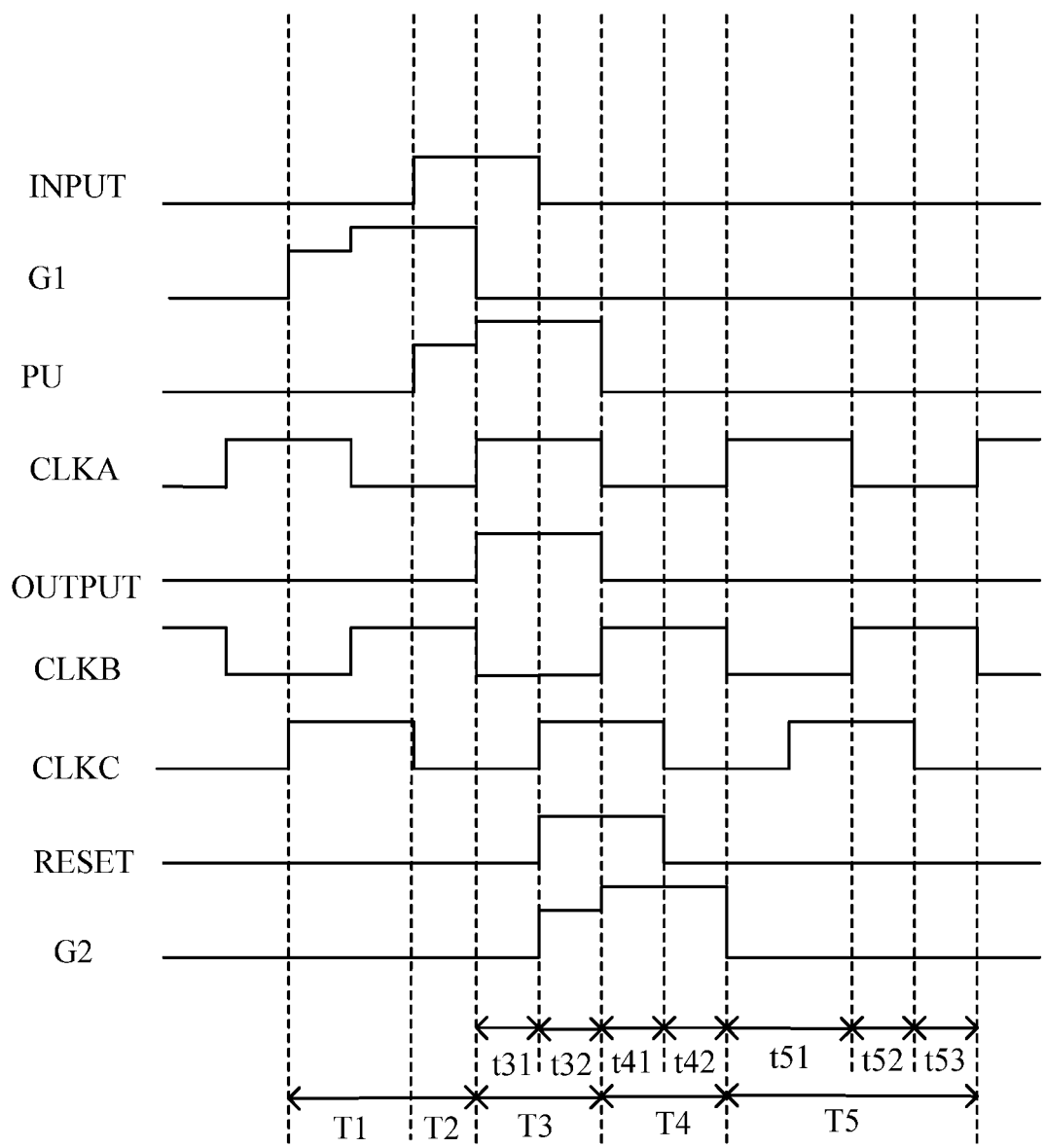
FIG. 11 is a timing diagram of a shift register according to an embodiment of the present disclosure.

The transistors M1 to M12 of the shift register in the embodiment of the present disclosure are all N-type thin film transistors. FIG. 11 is a timing diagram of the shift register according to an embodiment of the present disclosure. As shown in FIG. 10 and FIG. 11, the shift register according to the embodiment of the present disclosure includes twelve transistors M1 to M12, one capacitor C, nine signal input terminals INPUT, RESET, GCH1, GCH2, CLKA, CLKB, CLKC, G1 and G2, one signal output terminal OUTPUT and one power supply terminal VGL.

Specifically, the low level power supply terminal VGL keeps providing a low level signal, a signal inputted into the first enabling terminal GCH1 is a high level signal within a display frame and is a low level signal during a non-display time period, and a signal inputted into the second enabling terminal GCH2 is a high level signal beyond a display frame and is a low level signal within a display frame. The shift register operates periodically, and each display frame includes five periods T1 to T5. The operation process of the shift register in each period is described as follows.

In the first period T1, i.e., an initialization period, the pull-up node PU is at a low level, an input signal of the signal input terminal INPUT is at a low level, an input signal of the first control terminal G1 is at a high level, and the first transistor M1 is turned on. As the input signal of the signal input terminal INPUT is at a low level, a potential of the pull-up node PU is not pulled up. An input signal of the first enabling terminal GCH1 is a high level signal, the sixth transistor M6 and the seventh transistor M7 are turned on, and a potential of the pull-down node PD is pulled up, the tenth transistor M10 and the eleventh transistor M11 are turned on to transmit a low level signal of the low level power supply terminal VGL to the pull-up node PU. Thus, signals of the pull-up node PU and the signal output terminal OUTPUT are initialized into the low level signal of the low level power supply terminal VGL.

In this period, among the input terminals, input signals of the first control terminal G1, the third clock signal terminal CLKC and the first enabling terminal GCH1 are all at a high level, and input signals of the signal input terminal INPUT, the reset signal terminal RESET, the second enabling terminal GCH2 and the second control terminal G2 are all at a low level. An output signal of the signal output terminal OUTPUT is at a low level. It should be noted that an input signal of the first clock signal terminal CLKA is at a high level within the first half of this period and at a low level within the second half of the period, and an input signal of the second clock signal terminal CLKB is at a high level within the second half of the period and at a low level within the first half of the period. Input signals of the second clock signal terminal CLKB and the third clock signal terminal CLKC at both at a high level within the second half of the period, the third transistor M3 and the fourth transistor M4 are turned on, and the potential of the pull-up node PU is initialized into the low level signal of the low level power supply terminal VGL.

In the second period T2, i.e., the input period, the input signal of the first control terminal G1 is at a high level, the signal of the signal input terminal INPUT is at a high level, the first transistor M1 is turned on, pulling up the potential of the pull-up node PU to charge the capacitor C.

In this period, among the input terminals, the input signals of the signal input terminal INPUT, the first enabling terminal GCH1, the first control terminal G1 and the second clock signal terminal CLKB are at a high level, and the input signals of the reset signal terminal RESET, the second enabling terminal GCH2, the first clock signal terminal CLKA, the third clock signal terminal CLKC and the second control terminal G2 are at a low level. The output signal of the signal output terminal OUTPUT is at a low level, and though the sixth transistor M6 and the seventh transistor M7 are turned on due to the fact the first enabling terminal GCH1 keeps providing a high level signal, the fifth transistor M5 is not turned on and the potential of the pull-up node PU is not pulled down, as the potential of the pull-up node PU is at a high level and accordingly the eighth transistor M8 and the ninth transistor M9 are turned on, lowering the potential of the pull-down node PD. The potential of the pull-up node PU is at a high level, the second transistor M2 is turned on, and the output signal of the signal output terminal OUTPUT is at a low level as the input signal of the first clock signal terminal CLKA is at a low level.

The third period T3, i.e., the output period, includes a first output sub-period t31 and a second output sub-period t32.

In the first output sub-period t31, the input signal of the first clock signal terminal CLKA turns into a high level, the potential of the pull-up node PU keeps rising due to bootstrapping effect of the capacitor C, the high level of the pull-up node PU keeps the second transistor M2 in a turned-on state, and the signal output terminal OUTPUT outputs the signal of the first clock signal terminal CLKA, i.e., a cascade signal. Moreover, rising of the potential of the pull-up node PU improves conduction capability of the second transistor M2, ensuring charging of pixels.

In this period, among the input terminals, the input signals of the first clock signal terminal CLKA, the signal input terminal INPUT and the first enabling terminal GCH1 are at a high level, and the input signals of the reset signal terminal RESET, the second enabling terminal GCH2, the second clock signal terminal CLKB, the third clock signal terminal CLKC, the first control terminal G1 and the second control terminal G2 are at a low level, the output signal of the signal output terminal OUTPUT is at a high level, and the eighth transistor M8 and the ninth transistor M9 are kept turned on as the potential of the pull-up node PU is kept at a high level, thereby lowering the potential of the pull-down node PD. Since the potential of the pull-down node PD is at a low level, the tenth transistor M10 and the eleventh transistor M11 are not turned on, and potentials of the pull-up node PU and the signal output terminal OUTPUT are not pulled down. The signal of the signal input terminal INPUT is at a high level, and the first transistor M1 is turned off as the input signal of the first control signal is at a low level.

In the second output sub-period t32, the input signal of the second control terminal G2 is at a high level, the fifth transistor M5 is turned on, and the potential of the pull-up node PU is kept at a high level as the input signal of the reset signal terminal RESET is at a high level. The input signal of the first clock signal terminal CLKA is at a high level, the high level of the pull-up node PU turns on the second transistor M2 due to the fact the potential of the pull-up node PU is still at a high level, and the signal output terminal OUTPUT outputs the signal of the first clock signal terminal CLKA, i.e., the cascade signal. In addition, rising of the potential of the pull-up node PU improves the conduction capability of the second transistor M2, ensuring charging of the pixels.

In this period, among the input terminals, the input signals of the first clock signal terminal CLKA, the first enabling terminal GCH1, the reset terminal RESET, the third clock signal terminal CLKC and the second control terminal G2 are at a high level, and the input signals of the signal input terminal INPUT, the second enabling terminal GCH2, the second clock signal terminal CLKB and the first control terminal G1 are at a low level. The output signal of the signal output terminal OUTPUT is at a high level, and the eighth transistor M8 and the ninth transistor M9 are kept in a turned-on state as the potential of the pull-up node is still at a high level, thereby lowering the potential of the pull-down node PD. As the potential of the pull-down node PD is at a low level, the tenth transistor M10 and the eleventh transistor M11 are not turned on, and the potentials of the pull-up node PU and the signal output terminal OUTPUT are not pulled down. The input signal of the third clock signal terminal CLKC is at a high level, the fourth transistor M4 is turned on, the input signal of the second clock signal terminal CLKB is at a low level, and the third transistor M3 is turned off, furthering ensuring that the potential of the pull-up node PU is not pulled down by the low level signal of the low level power supply terminal VGL.

The fourth period T4, i.e., the reset period, includes a first reset sub-period t41 and a second reset sub-period t42.

In the first reset sub-period t41, the input signal of the second control terminal G2 is at a high level, the fifth transistor M5 is turned on, and the input signal of the reset signal terminal RESET is at a high level. As the input signals of the second clock signal terminal CLKB and the third clock signal terminal CLKC are at a high level, the third transistor M3 and the fourth transistor M4 are turned on, and the potential of the pull-up node PU is pulled up to the low level of the low level power supply terminal VGL. As the potential of the pull-up node PU is at a low level, the eighth transistor M8 and the ninth transistor M9 are turned off. The input signal of the first enabling terminal GCH1 is at a high level, the sixth transistor M6 and the seventh transistor M7 are turned on, the potential of the pull-down node PD is pulled up, the tenth transistor M10 is turned on, and the potential of the pull-up node PU is kept at the low level of the low level power supply terminal VGL to filter out noises from the pull-up node PU. The eleventh transistor M11 is turned on by the high level of the pull-down node PD, and the potential of the signal output terminal OUTPUT is pulled down to the low level of the low level power supply terminal VGL to filter out noises from the signal output terminal OUTPUT.

In this sub-period, among the input terminals, the input signals of the reset signal terminal RESET, the second control terminal G2, the second clock signal terminal CLKB, the third clock signal terminal CLKC and the first enabling terminal GCH1 are at a high level; and the input signals of the signal input terminal INPUT, the first control terminal G1, the first clock signal terminal CLKA and the second enabling terminal GCH2; and the output signal of the signal output terminal OUTPUT is at a low level.

In the second reset sub-period t42, the input signal of the second control terminal G2, the fifth transistor M5 is turned on, the input signal of the reset signal terminal RESET is at a low level and the potential of the pull-up node PU is pulled down. As the potential of the pull-up node PU is at a low level, the eighth transistor M8 and the ninth transistor M9 are turned off, the input signal of the first enabling terminal GCH1 is at a high level, the sixth transistor M6 and the seventh transistor M7 are turned on and the potential of the pull-down node PD is pulled up. As the potential of the pull-down node PD is at a high level, the tenth transistor M10 is turned on, the potential of the pull-up node PU is kept at the low level of the low level power supply terminal VGL to further filter out the noises from the pull-up node PU, the eleventh transistor M11 is turned on, and the potential of the signal output terminal OUTPUT is pulled down to the low level of the low level power supply terminal VGL to filter out noises from the signal output terminal OUTPUT.

In this sub-period, among the input terminals, the input signals of the second control terminal G2, the second clock signal terminal CLKB and the first enabling terminal GCH1 are at a high level, and the input signals of the signal input terminal INPUT, the reset signal terminal RESET, the first clock signal terminal CLKA, the third clock signal terminal CLKC, the first control terminal G1 and the second enabling terminal GCH2 are at a low level; and the output signal of the signal output terminal OUTPUT is at a low level.

The fifth period T5 includes a first sub-period t51, a second sub-period t52 and a third sub-period t53.

In the first sub-period t51, the input signal of the first clock signal terminal CLKA is at a high level, the second transistor M2 is turned off as the potential of the signal output terminal OUTPUT is at a low level, and accordingly, the eighth transistor M8 and the ninth transistor M9 are turned off. The input signal of the first enabling terminal GCH1 is at a high level, the sixth transistor M6 and the seventh transistor M7 are turned on, the potential of the pull-down node PD is pulled up by the high level of the first enabling terminal GCH1, the tenth transistor M10 is turned on, and the potential of the pull-up node PU is kept at a low level, to eliminate noises at the pull-up node PU. The eleventh transistor M11 is turned on by the high level of the pull-down node PD, and the potential of the signal output terminal OUTPUT is kept at a low level to eliminate the noises at the signal output terminal OUTPUT.

In this sub-period, among the input terminals, the input signals of the first clock signal terminal CLKA and the first enabling terminal GCH1 are at a high level, the input signals of the signal input terminal INPUT, the first control terminal G1, the reset signal terminal RESET, the second control terminal G2, the second clock signal terminal CLKB and the second enabling terminal GCH2 are at a low level, and the input signal of the third clock signal terminal CLKC is at a low level within the first half of this sub-period and at a high level within the second half of the sub-period.

In the second sub-period t52, the input signals of the second clock signal terminal CLKB and the third clock signal terminal CLKC are at a high level, the third transistor M3 and the fourth transistor M4 are turned on, and the potential of the pull-up node PU is pulled down. The potential of the first clock signal terminal CLKA is at a low level, the second transistor M2 is turned off, the output signal of the signal output terminal OUTPUT is at a low level and accordingly, the eighth transistor M8 and the ninth transistor M9 are turned off. The input signal of the first enabling terminal GCH1 is at a high level, the sixth transistor M6 and the seventh transistor M7 are turned on, the potential of the pull-down node PD is pulled up by the high level of the first enabling terminal GCH1, the tenth transistor M10 is turned on, and the potential of the pull-up node PU is kept at a low level, to eliminate the noises from the pull-up node PU. The eleventh transistor M11 is turned on by the high level of the pull-down node PD, and the potential of the signal output terminal OUTPUT is kept at a low level, to filter out the noises from the signal output terminal OUTPUT.

In this sub-period, among the input terminals, the input signals of the second clock signal terminal CLKB, the third clock signal terminal CLKC and the first enabling terminal GCH1 are at a high level, and the input signals of the signal input terminal INPUT, the first control terminal G1, the second control terminal G2, the reset signal terminal RESET, the first clock signal terminal CLKA and the second enabling terminal GCH2 are at a low level.

In the third sub-period t53, the input signal of the first clock signal terminal CLKA is at a low level, the second transistor M2 is turned off as the potential of the pull-up node PU is at a low level, the output signal of the signal output terminal OUTPUT is at a low level, and the eighth transistor M8 and the ninth transistor M9 are turned off. The input signal of the first enabling terminal GCH1 is at a high level, the sixth transistor M6 and the seventh transistor M7 are turned on, the potential of the pull-down node PD is at a high level, the tenth transistor M10 is turned on, the potential of the pull-up node PU is kept at a low level to reduce noises, the eleventh transistor M11 is turned on, and the potential of the signal output terminal OUTPUT is kept at a low level to reduce noises. The input signal of the third clock signal terminal CLKC is at a low level, the fourth transistor M4 is turned off, the input signal of the second clock signal terminal CLKB is at a high level, and the third transistor M3 is turned on.

In this sub-period, among the input terminals, the input signals of the second clock signal terminal CLKB and the first enabling terminal GCH1 are at a high level, and the input signals of the signal input terminal INPUT, the first control terminal G1, the reset signal terminal RESET, the first clock signal terminal CLKA, the third clock signal terminal CLKC, the second control terminal G2 and the second enabling terminal GCH2 are at a low level.

After the fifth period T5, a current stage of shift register remains as it is in the fifth period, until the first control terminal G1 receives another high level signal.

In addition, it should be noted that beyond a display frame, i.e., in a non-display period, the input signal of the second enabling terminal GCH2 is at a high level, and the twelfth transistor M12 is turned on to pull down the output signal of the signal output terminal OUTPUT, to continuously filter out the noises from the signal output terminal OUTPUT.

It should also be noted that the operation sequence of shift register shown in FIG. 11 applies to multiple stages of shift registers except the first state of shift register, the second stage of shift register, the penultimate stage of shift register and the last stage of shift register.

Figure 12:
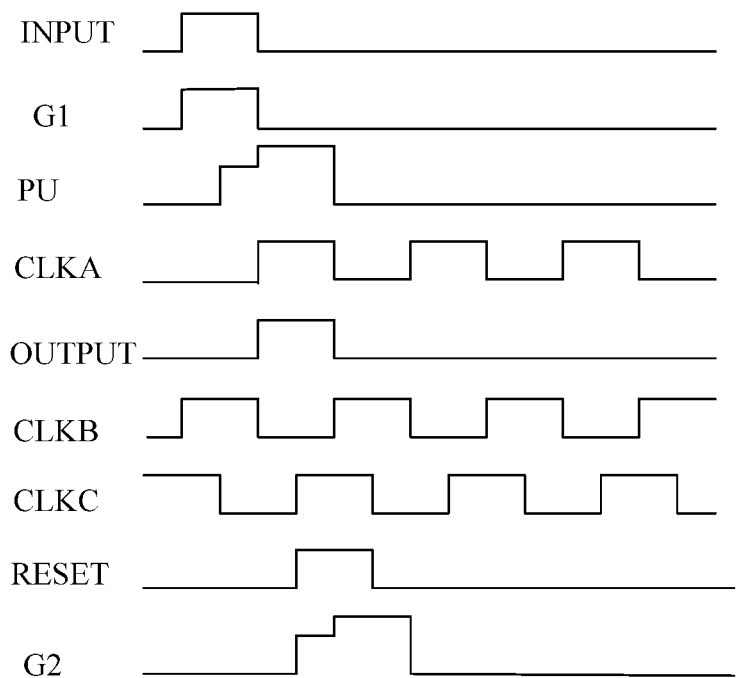
FIG. 12 is a timing diagram of a first stage of shift register according to an embodiment of the present disclosure.
Figure 13:
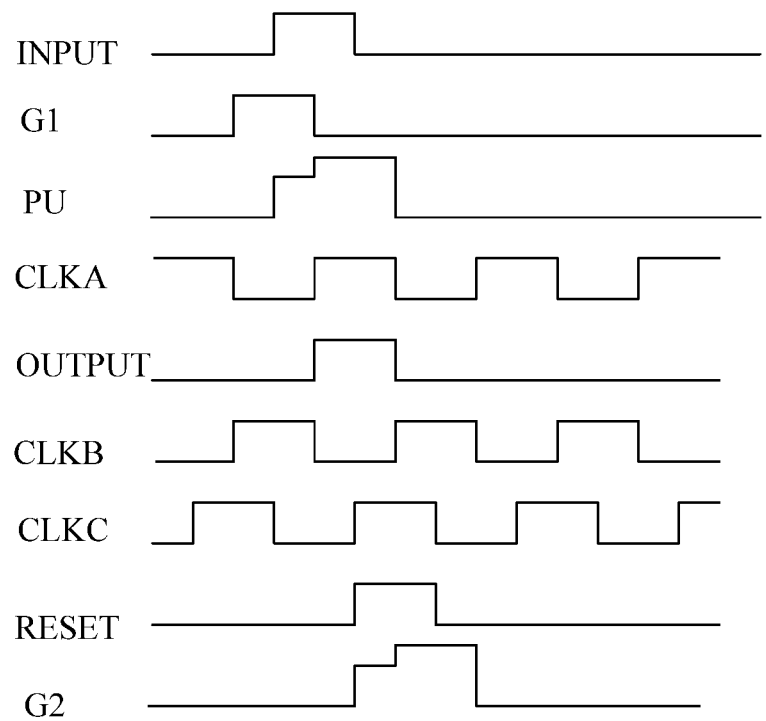
FIG. 13 is a timing diagram of a second stage of shift register according to an embodiment of the present disclosure.
Figure 14:
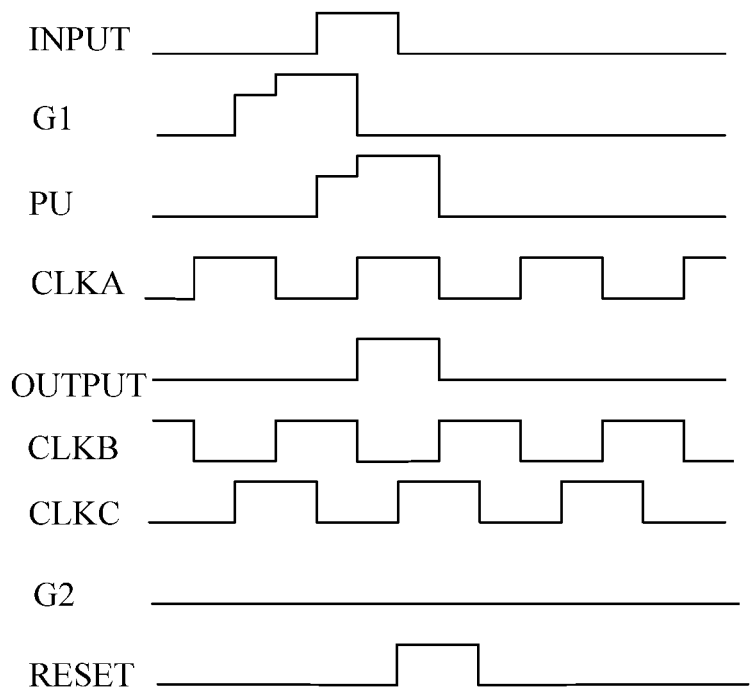
FIG. 14 is a timing diagram of a penultimate stage of shift register according to an embodiment of the present disclosure.
Figure 15:
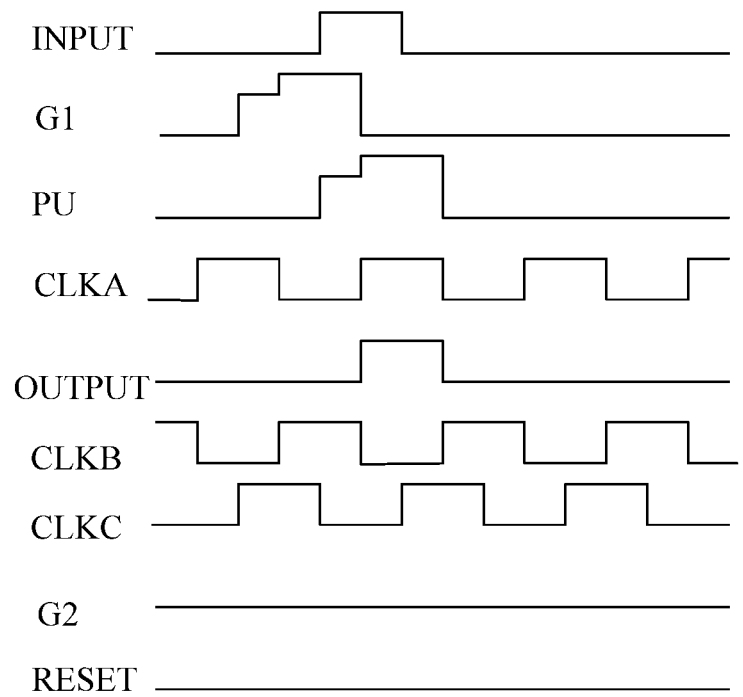
FIG. 15 is a timing diagram of a last stage of shift register according to an embodiment of the present disclosure.

Further, FIG. 12 is a timing diagram of the first stage of shift register according to an embodiment of the present disclosure, FIG. 13 is a timing diagram of the second stage of shift register according to an embodiment of the present disclosure, FIG. 14 is a timing diagram of the penultimate stage of shift register according to an embodiment of the present disclosure, and FIG. 15 is a timing diagram of the last stage of shift register according to an embodiment of the present disclosure. The difference between the operation sequence of the first stage of shift register shown in FIG. 12 and that of the shift register shown in FIG. 11 lies in that the signals of the first control terminal G1 and the signal input terminal INPUT of the first stage of shift register are both pulse signals, while the signal of the first control terminal G1 of the shift register shown in FIG. 11 is a stairstep signal. As shown in FIG. 13, the signal of the first control terminal G1 of the second stage of shift register is also a pulse signal and has a same duration as the signal of the first control terminal G1 of the first stage of shift register. The difference between the operation sequences of the second stage of shift register shown in FIG. 13 and the first stage of shift register shown in FIG. 12 lies in that the signal of the first control terminal G1 of the second stage of shift registers is half a cycle ahead of the signal of the signal input terminal INPUT. The difference between the operation sequences of the penultimate shift register shown in FIG. 14 and the shift register shown in FIG. 11 lies in that the second control terminal G2 of the penultimate shift register always provides a low level signal. The difference between the operation sequences of the last stage of shift register shown in FIG. 15 and the shift register shown in FIG. 11 lies in that the second control terminal G2 and the reset signal terminal RESET of the last stage of shift register always provide low level signals.

Specifically, the first state of shift register, the second stage of shift register, the penultimate stage of shift register and the last stage of shift register. each operates in a manner as described above, which is therefore not described redundantly.

Figure 16:
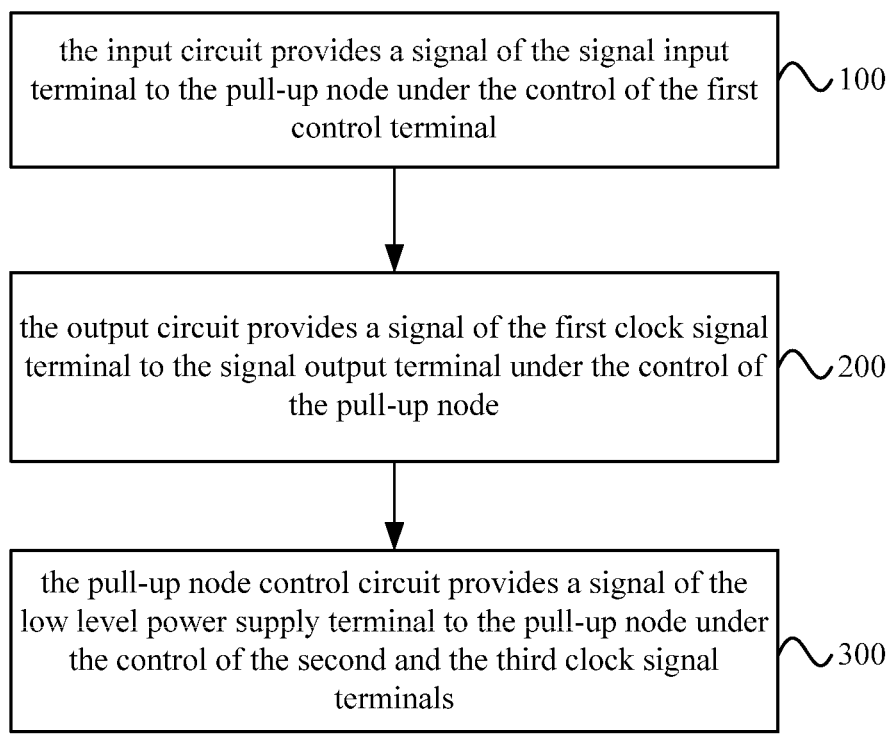
FIG. 16 is a flowchart of a method for driving a shift register according to an embodiment of the present disclosure.

Based on the idea according to the foregoing embodiments, a method for driving a shift register is further provided according to an embodiment of the present disclosure, which is applied to the shift registers according to the foregoing embodiments. FIG. 16 is a flowchart of the method for driving a shift register according to an embodiment of the present disclosure. Each shift register includes a signal input terminal, a reset signal terminal, a first enabling terminal, a second enabling terminal, a first clock signal terminal, a second clock signal terminal, a third clock signal terminal, a first control terminal and a second control terminal, and further includes an input circuit, an output circuit, a pull-up node control circuit, a reset circuit, a pull-down node control circuit, an output control terminal and a noise reduction circuit. As shown in FIG. 16, the method for driving the shift register according to the embodiment of the present disclosure includes steps 100 to 300.

In step 100, the input circuit provides a signal of the signal input terminal to the pull-up node under the control of the first control terminal.

In step 200, the output circuit provides a signal of the first clock signal terminal to the signal output terminal under the control of the pull-up node.

In step 300, the pull-up node control circuit provides a signal of a first level power supply terminal to the pull-up node under the control of the second clock signal terminal and the third clock signal terminal.

The method for driving a shift register according to the embodiment of the present disclosure is applied to the shift register according to the above embodiment, and can achieve similar technical effects by similar implementation principles, which are therefore not redundantly described herein.

In an embodiment, the method for driving a shift register according to the present disclosure further includes providing, by the reset circuit, a signal of the signal reset terminal to the pull-up node under the control of the second control terminal.

In an embodiment, the method for driving a shift registers according to the present disclosure further includes providing, by the pull-down node control circuit, a signal of the first enabling terminal or the low level power supply terminal to the pull-down node under the control of the first enabling terminal and the pull-up node.

In an embodiment, the method for driving a shift register according to the present disclosure further includes providing, by the noise reduction circuit, the signal of the low level power supply terminal to the pull-up node and the signal output terminal under the control of the pill-down node.

In an embodiment, the method for driving a shift register according to the present disclosure further includes providing, by the output control circuit, the signal of the low level power supply terminal to the signal output terminal under the control of the second enabling terminal.

Figure 17:
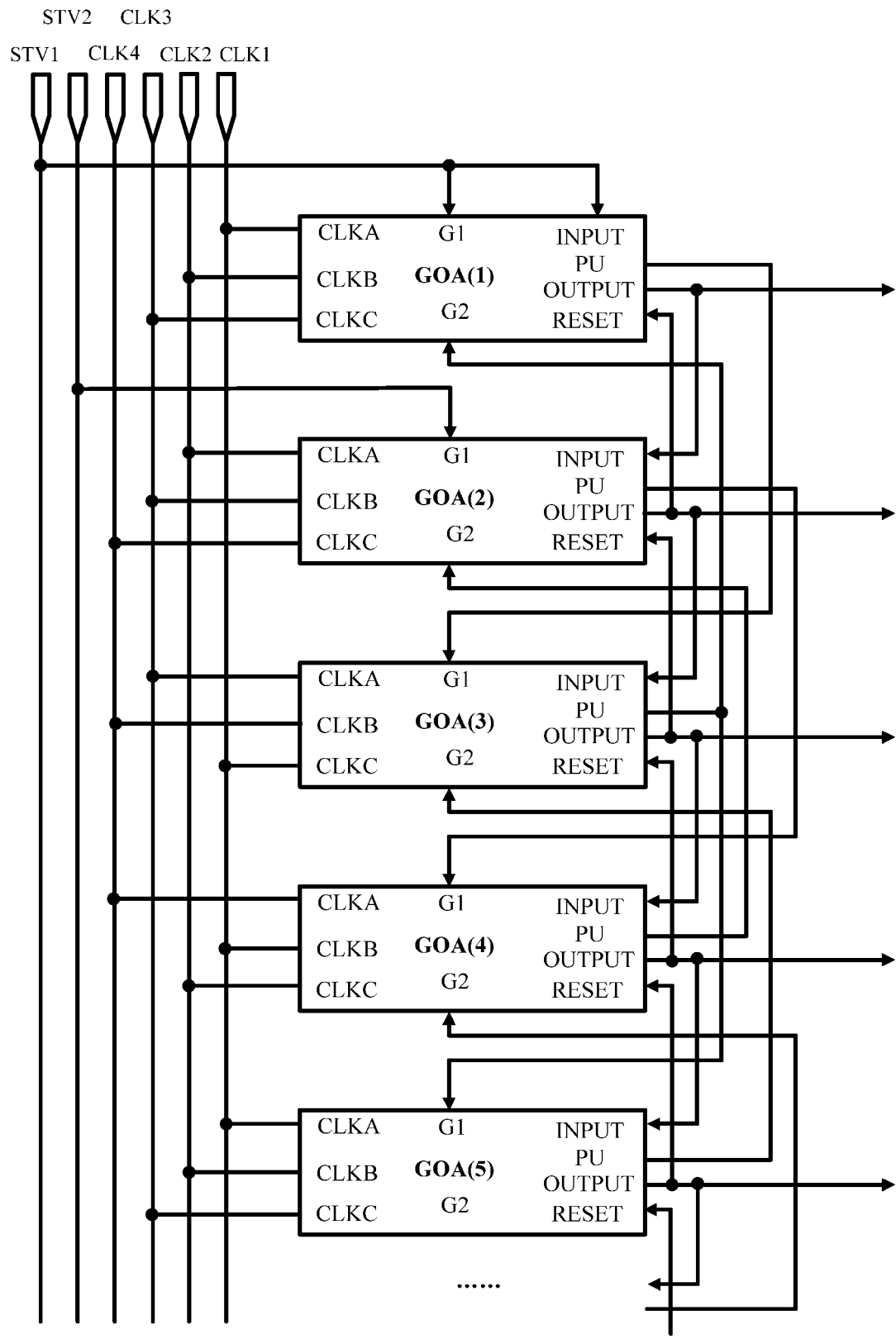
FIG. 17 is a schematic diagram of a gate drive circuitry according to an embodiment of the present disclosure.

Based on the idea according to the foregoing embodiments, a gate drive circuitry is further provided according to an embodiment of the present disclosure. FIG. 17 is a schematic diagram of the gate driver according to an embodiment of the present disclosure. As shown in FIG. 17, the gate drive circuitry according to the embodiment of the present disclosure includes multiple cascaded shift registers, and further includes a first initial signal terminal STV1 and a second signal terminal STV2.

Specifically, a first stage of shift register has a first control terminal G1 and a signal input terminal INPUT both connected to the first initial signal terminal STV1, a reset signal terminal RESET connected to a signal output terminal OUTPUT of a second stage of shift register, and a second control terminal G2 connected to a pull-up node PU of a third stage of shift register. The second stage of shift register has a first control terminal G1 connected to the second initial signal terminal STV2, a signal input terminal INPUT connected to a signal output terminal OUTPUT of the first stage of shift register, a reset signal terminal RESET connected to a signal output terminal OUTPUT of the third stage of shift register, and a second control terminal G2 connected to a pull-up node PU of a fourth stage of shift register. An $N^{th}$ stage of shift register has a first control terminal G1 connected to a pull-up node PU of an $(N-2)^{th}$ stage of shift register, a signal input terminal INPUT connected to a signal output terminal OUTPUT of an $(N-1)^{th}$ stage of shift register, a reset signal terminal RESET connected to a signal output terminal OUTPUT of an $(N+1)^{th}$ stage of shift register, and a second control terminal G2 connected to a pull-up node PU of an $(N+2)^{th}$ stage of shift register, where $N \geq 3$.

The shift registers are same as those provided according to the foregoing embodiments and can achieve similar technical effects, which are not redundantly described herein.

As shown in FIG. 17, the gate drive circuitry according to some optional embodiments of the present disclosure further includes, a first clock terminal CLK1, a second clock terminal CLK2, a third clock terminal CLK3 and a fourth clock terminal CLK4.

In a case of N=4i+1, the $N^{th}$ stage of shift register has a first clock signal terminal CLKA connected to the first clock terminal CLK1, a second clock signal terminal CLKB connected to the second clock terminal CLK2, and a third clock signal terminal CLKC connected to the third clock terminal CLK3; in a case of N=4i+2, the $N^{th}$ stage of shift register has a first clock signal terminal CLKA connected to the second clock terminal CLK2, a second clock signal terminal CLKB connected to the third clock terminal CLK3, and a third clock signal terminal CLKC connected to the fourth clock terminal CLK4; in a case of N=4i+3, the $N^{th}$ stage of shift register has a first clock signal terminal CLKA connected to the third clock terminal CLK3, a second clock signal terminal CLKB connected to the fourth clock terminal CLK4, and a third clock signal terminal CLKC connected to the first clock terminal CLK1; and in a case of N=4i, the $N^{th}$ stage of shift register has a first clock signal terminal CLKA connected to the fourth clock terminal CLK4, a second clock signal terminal CLKB connected to the first clock terminal CLK1, and a third clock signal terminal CLKC connected to the second clock terminal CLK2, where $i \geq 0$.

Figure 18:
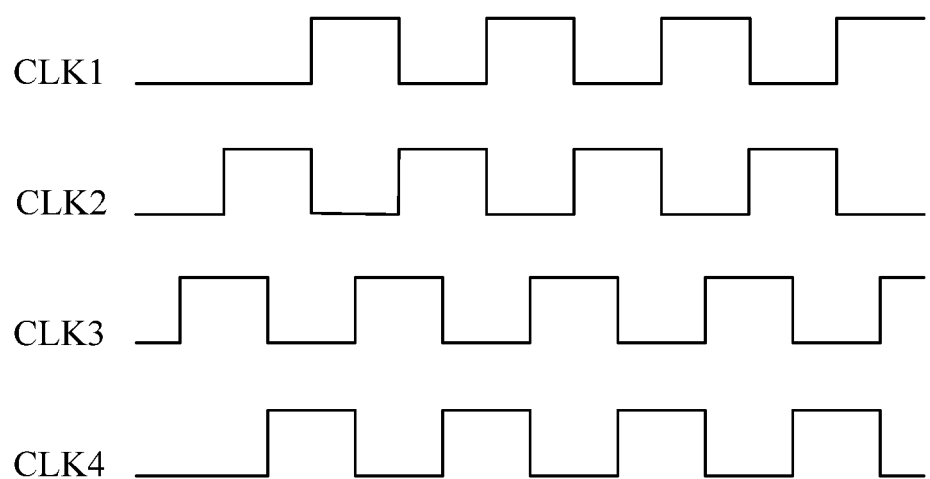
FIG. 18 is a timing diagram of signals of four clock terminals according to an embodiment of the present disclosure.

FIG. 18 is a timing diagram of signals of four clock terminals according to some optional embodiments. As shown in FIG. 18, signals of the first clock terminal CLK1 and the second clock terminal CLK2 are in antiphase, signals of the third clock terminal CLK3 and the fourth clock terminal CLK4 are in antiphase, the signal of the third clock terminal CLK3 is delayed by half a cycle with respect to the signal of the first clock terminal CLK1, and the signal of the fourth clock terminal CLK4 is delayed by half a cycle with respect to the signal of the second clock terminal CLK2.

Based on the idea according to the foregoing embodiments, a display apparatus is further provided according to an embodiment of the present disclosure, which includes the gate drive circuitry according to the foregoing embodiments and multiple gate lines, where the gate drive circuitry is configured to turn on or turn off the multiple gate lines.

Specifically, the display apparatus may be any product or component such as an OLED panel, a cellphone, a tablet computer, a television, a monitor, a laptop computer, a digital frame and a navigator.

Unless otherwise defined, technical terms or scientific terms used in the present disclosure should be interpreted according to common meanings thereof as commonly understood by those of ordinary skills in the art. Such terms as "first", "second" and the like used in the present disclosure do not represent any order, quantity or importance, but are merely used to distinguish different components. Such terms as "including", or "comprising" and the like mean that an element or an article preceding the term contains elements or items and equivalents thereof behind the term, but does not exclude other elements or items. Such terms as "connected", or "interconnected" and the like are not limited to physical or mechanical connections, but may include electrical connections, whether direct connection or indirect connection. Such terms as "on", "under", "left", "right" and the like are only used to represent a relative position relationship, and when an absolute position of a described object is changed, the relative position relationship thereof may also be changed accordingly.

It may be understood that when an element such as a layer, a film, a region or a substrate is referred to as being "on" or "under" another element, the element may be "directly" "on" or "under" the another element, or there may exist an intervening element.

The above embodiments are merely optional embodiments of the present disclosure. It should be noted that numerous improvements and modifications may be made by those skilled in the art without departing from the principle of the present disclosure, and these improvements and modifications shall also fall within the scope of the present disclosure.

What is claimed is:

1. A shift register, comprising:
an input circuit, an output circuit and a pull-up node control circuit,
wherein the input circuit is connected to a signal input terminal, a pull-up node and a first control terminal, and is configured to provide a signal of the signal input terminal to the pull-up node under the control of the first control terminal;
the output circuit is connected to the pull-up node, a first clock signal terminal and a signal output terminal, and is configured to output a signal of the first clock signal terminal to the signal output terminal under the control of the pull-up node;
the pull-up node control circuit is connected to the pull-up node, a second clock signal terminal, a third clock signal terminal and a first voltage terminal, and is configured to provide a signal of the first voltage terminal to the pull-up node under the control of the second clock signal terminal and the third clock signal terminal; and
the shift register further comprises:
a pull-down node control circuit, connected to a first enabling terminal, the pull-up node, a pull-down node and the first voltage terminal, and configured to provide a signal of the first enabling terminal or the first voltage terminal to the pull-down node under the control of the first enabling terminal and the pull-up node.

2. The shift register according to claim 1, further comprising:
a reset circuit, connected to the pull-up node, a second control terminal, and a reset signal terminal, and configured to provide a signal of the reset signal terminal to the pull-up node under the control of the second control terminal.

3. The shift register according to claim 1, further comprising:
a noise reduction circuit, connected to the pull-down node, the pull-up node, the first voltage terminal and the signal output terminal, and configured, under the control of the pull-down node, to provide the signal of the first voltage terminal to the pull-up node and the signal output terminal during a display time period, to filter out noises from the pull-up node and the signal output terminal during the display time period.

4. The shift register according to claim 3, further comprising:
an output control circuit, connected to a second enabling terminal, the first voltage terminal and the signal output terminal, and configured to provide the signal of the first voltage terminal to the signal output terminal during a non-display time period under the control of the second enabling terminal, to filter out a noise from the signal output terminal during the non-display time period.

5. The shift register according to claim 1, wherein the input circuit comprises a first transistor, and the first transistor has a gate electrode connected to the first control terminal, a first electrode connected to the signal input terminal, and a second electrode connected to the pull-up node; and
wherein the output circuit comprises a capacitor and a second transistor, a first terminal of the capacitor is connected to the pull-up node, a second terminal of the capacitor is connected to the signal output terminal, and the second transistor has a gate electrode connected to the pull-up node, a first electrode connected to the first clock signal terminal, and a second electrode connected to the signal output terminal.

6. The shift register according to claim 1, wherein the pull-up node control circuit comprises a third transistor and a fourth transistor,
wherein the third transistor has a gate electrode connected to the second clock signal terminal, a first electrode connected to the pull-up node, and a second electrode connected to a first electrode of the fourth transistor, and
the fourth transistor has a gate electrode connected to the third clock signal terminal, and a second electrode connected to the first voltage terminal.

7. The shift register according to claim 2, wherein the reset circuit comprises:
a fifth transistor,
wherein the fifth transistor has a gate electrode connected to the second control terminal, a first electrode connected to the pull-up node, and a second electrode connected to the reset signal terminal.

8. The shift register according to claim 1, wherein the pull-down node control circuit comprises:
a sixth transistor, a seventh transistor, an eighth transistor and a ninth transistor,
wherein the sixth transistor has a gate electrode and a first electrode both connected to the first enabling terminal, and a second electrode connected to a gate electrode of the seventh transistor,
the seventh transistor has a first electrode connected to the first enabling terminal, and a second electrode connected to the pull-down node,
the eighth transistor has a gate electrode connected to the pull-up node, a first electrode connected to the pull-down node, and a second electrode connected to the first voltage terminal, and
the ninth transistor has a gate electrode connected to the pull-up node, a first electrode connected to the gate electrode of the seventh transistor, and a second electrode connected to the first voltage terminal.

9. The shift register according to claim 3, wherein the noise reduction circuit comprises:
a tenth transistor and an eleventh transistor,
wherein the tenth transistor has a gate electrode connected to the pull-down node, a first electrode connected to the pull-up node, and a second electrode connected to the first voltage terminal, and
the eleventh transistor has a gate electrode connected to the pull-down node, a first electrode connected to the signal output terminal, and a second electrode connected to the first voltage terminal.

10. The shift register according to claim 4, wherein the output control circuit comprises:
a twelfth transistor,
wherein the twelfth transistor has a gate electrode connected to the second enabling terminal, a first electrode connected to the signal output terminal, and a second electrode connected to the first voltage terminal.

11. The shift register according to claim 1, further comprising:
a reset circuit, a noise reduction circuit and an output control circuit,
wherein the input circuit comprises a first transistor, the output circuit comprises a capacitor and a second transistor, the pull-up node control circuit comprises a third transistor and a fourth transistor, the reset circuit comprises a fifth transistor, the pull-down node control circuit comprises a sixth transistor, a seventh transistor, an eighth transistor and a ninth transistor, the noise reduction circuit comprises a tenth transistor and an eleventh transistor, and the output control circuit comprises a twelfth transistor;

the first transistor has a gate electrode connected to the first control terminal, a first electrode connected to the signal input terminal, and a second electrode connected to the pull-up node;

the capacitor has a first terminal connected to the pull-up node and a second terminal connected to the signal output terminal;

the second transistor has a gate electrode connected to the pull-up node, a first electrode connected to the first clock signal terminal, and a second electrode connected to the signal output terminal;

the third transistor has a gate electrode connected to the second clock signal terminal, a first electrode connected to the pull-up node, and a second electrode connected to a first electrode of the fourth transistor;

the fourth transistor has a gate electrode connected to the third clock signal terminal, and a second electrode connected to the first voltage terminal;

the fifth transistor has a gate electrode connected to the second control terminal, a first electrode connected to the pull-up node, and a second electrode connected to a reset signal terminal;

the sixth transistor has a gate electrode and a first electrode both connected to the first enabling terminal, and a second electrode connected to a gate electrode of the seventh transistor;

the seventh transistor has a first electrode connected to the first enabling terminal, and a second electrode connected to the pull-down node;

the eighth transistor has a gate electrode connected to the pull-up node, a first electrode connected to the pull-down node, and a second electrode connected to the first voltage terminal;

the ninth transistor has a gate electrode connected to the pull-up node, a first electrode connected to the gate electrode of the seventh transistor, and a second electrode connected to the first voltage terminal;

the tenth transistor has a gate electrode connected to the pull-down node, a first electrode connected to the pull-up node, and a second electrode connected to the first voltage terminal;

the eleventh transistor has a gate electrode connected to the pull-down node, a first electrode connected to the signal output terminal, and a second electrode connected to the first voltage terminal; and the twelfth transistor has a gate electrode connected to a second enabling terminal, a first electrode connected to the signal output terminal, and a second electrode connected to the first voltage terminal.

12. The shift register according to claim 11, wherein the first voltage terminal is a low level power supply terminal in a case that the first to the twelfth transistors are all N-type thin film transistors, and is a high level power supply terminal in a case that the first to the twelfth transistors are all P-type thin film transistors, phases of the signals of the first clock signal terminal and the second clock signal terminal are inversed, and a signal of the third signal clock terminal is delayed by half a cycle with respect to the signal of the first signal clock terminal.

13. A method for driving a shift register, applied to the shift register according to claim 1, comprising:

providing a signal of the signal input terminal to the pull-up node in response to a signal of the first control terminal;

providing a signal of the first clock signal terminal to the signal output terminal under the control of a level of the pull-up node; and providing a signal of the first voltage terminal to the pull-up node in response to signals of the second clock signal terminal and the third clock signal terminal.

14. A gate drive circuitry, comprising a plurality of cascaded shift registers, a first initial signal terminal and a second initial signal terminal, wherein each of the plurality of shift registers comprises: an input circuit, an output circuit and a pull-up node control circuit, wherein the input circuit is connected to a signal input terminal, a pull-up node and a first control terminal and is configured to provide a signal of the signal input terminal to the pull-up node under the control of the first control terminal, the output circuit is connected to the pull-up node, a first clock signal terminal and a signal output terminal and is configured to output a signal of the first clock signal terminal to the signal output terminal under the control of the pull-up node, and the pull-up node control circuit is connected to the pull-up node, a second clock signal terminal, a third clock signal terminal and a first voltage terminal and is configured to provide a signal of the first voltage terminal to the pull-up node under the control of the second clock signal terminal and the third clock signal terminal;

a first stage of the shift registers comprises a first control terminal and a signal input terminal both connected to the first initial signal terminal, a reset signal terminal connected to a signal output terminal of a second stage of the shift registers, and a second control terminal connected to a pull-up node of a third stage of the shift registers, the second stage of the shift registers comprises a first control terminal connected to the second initial signal terminal, a signal input terminal connected to a signal output terminal of the first stage of the shift registers, a reset signal terminal connected to a signal output terminal of the third stage of the shift registers, and a second control terminal connected to a pull-up node of a fourth stage of the shift registers, and an $(N+2)^{th}$ stage of the shift registers comprises a first control terminal connected to a pull-up node of an $N^{th}$ stage of the shift registers, a signal input terminal connected to a signal output terminal of an $(N+1)^{th}$ stage of the shift registers, a reset signal terminal connected to a signal output terminal of an $(N+3)^{th}$ stage of the shift registers, and a second control terminal connected to a pull-up node of an $(N+4)^{th}$ stage of the shift registers, where N is a positive integer.

15. The gate drive circuitry according to claim 14, further comprising: a first clock terminal, a second clock terminal, a third clock terminal, a fourth clock terminal, wherein in a case of $N=4i+1$, the $N^{th}$ stage of the shift registers has a first clock signal terminal connected to the first clock terminal, a second clock signal terminal connected to the second clock terminal, and a third clock signal terminal connected to a third clock terminal, in a case of N=4i+2, the $N^{th}$ stage of the shift registers has a first clock signal terminal connected to the second clock terminal, a second clock signal terminal connected to the third clock terminal, and a third clock signal terminal connected to the fourth clock terminal, in a case of N=4i+3, the $N^{th}$ stage of the shift registers has a first clock signal terminal connected to the third clock terminal, a second clock signal terminal connected to the fourth clock terminal, and a third clock signal terminal connected to the first clock terminal, and in a case of N=4i, the $N^{th}$ stage of the shift registers has a first clock signal terminal connected to the fourth clock terminal, a second clock signal terminal connected to the first clock terminal, and a third clock signal terminal connected to the second clock terminal, where i is a positive integer.

16. The gate drive circuitry according to claim 14, wherein each of the plurality of shift registers further comprises:
a reset circuit, connected to the pull-up node, the second control terminal, and the reset signal terminal, and configured to provide a signal of the reset signal terminal to the pull-up node under the control of the second control terminal;
a pull-down node control circuit, connected to a first enabling terminal, the pull-up node, a pull-down node and the first voltage terminal, and configured to provide a signal of the first enabling terminal or the first voltage terminal to the pull-down node under the control of the first enabling terminal and the pull-up node;
a noise reduction circuit, connected to the pull-down node, the pull-up node, the first voltage terminal and the signal output terminal, and configured, under the control of the pull-down node, to provide the signal of the first voltage terminal to the pull-up node and the signal output terminal during a display time period, to filter out noises from the pull-up node and the signal output terminal during the display time period; and
an output control circuit, connected to a second enabling terminal, the first voltage terminal and the signal output terminal, and configured to provide the signal of the first voltage terminal to the signal output terminal during a non-display time period under the control of the second enabling terminal, to filter out noises from the signal output terminal during the non-display time period.

17. The gate drive circuitry according to claim 14, wherein each of the plurality of shift registers further comprises:
a reset circuit, a pull-down node control circuit, a noise reduction circuit and an output control circuit,
wherein the input circuit comprises a first transistor, the output circuit comprises a capacitor and a second transistor, the pull-up node control circuit comprises a third transistor and a fourth transistor, the reset circuit comprises a fifth transistor, the pull-down node control circuit comprises a sixth transistor, a seventh transistor, an eighth transistor and a ninth transistor, the noise reduction circuit comprises a tenth transistor and an eleventh transistor, and the output control circuit comprises a twelfth transistor;
the first transistor has a gate electrode connected to the first control terminal, a first electrode connected to the signal input terminal, and a second electrode connected to the pull-up node;
the capacitor has a first terminal connected to the pull-up node and a second terminal connected to the signal output terminal;
the second transistor has a gate electrode connected to the pull-up node, a first electrode connected to the first clock signal terminal, and a second electrode connected to the signal output terminal;
the third transistor has a gate electrode connected to the second clock signal terminal, a first electrode connected to the pull-up node, and a second electrode connected to a first electrode of the fourth transistor;
the fourth transistor has a gate electrode connected to the third clock signal terminal, and a second electrode connected to the first voltage terminal;
the fifth transistor has a gate electrode connected to the second control terminal, a first electrode connected to the pull-up node, and a second electrode connected to the reset signal terminal;
the sixth transistor has a gate electrode and a first electrode both connected to a first enabling terminal, and a second electrode connected to a gate electrode of the seventh transistor;
the seventh transistor has a first electrode connected to the first enabling terminal, and a second electrode connected to a pull-down node;
the eighth transistor has a gate electrode connected to the pull-up node, a first electrode connected to the pull-down node, and a second electrode connected to the first voltage terminal;
the ninth transistor has a gate electrode connected to the pull-up node, a first electrode connected to the gate electrode of the seventh transistor, and a second electrode connected to the first voltage terminal;
the tenth transistor has a gate electrode connected to the pull-down node, a first electrode connected to the pull-up node, and a second electrode connected to the first voltage terminal;
the eleventh transistor has a gate electrode connected to the pull-down node, a first electrode connected to the signal output terminal, and a second electrode connected to the first voltage terminal; and
the twelfth transistor has a gate electrode connected to a second enabling terminal, a first electrode connected to the signal output terminal, and a second electrode connected to the first voltage terminal.

18. The gate drive circuitry according to claim 15, wherein phases of signals of the first clock terminal and the second clock terminal are inversed, phases of signals of the third clock terminal and the fourth clock terminal are inversed, and the signal of the third clock terminal is delayed by half a cycle with respect to the signal of the first clock terminal.

19. A display apparatus, comprising the gate drive circuitry according to claim 14, and a plurality of gate lines, wherein the gate drive circuitry is configured to turn on or turn off the plurality of gate lines.

20. A shift register, comprising:
an input circuit, an output circuit and a pull-up node control circuit,
wherein the input circuit is connected to a signal input terminal, a pull-up node and a first control terminal, and is configured to provide a signal of the signal input terminal to the pull-up node under the control of the first control terminal;
the output circuit is connected to the pull-up node, a first clock signal terminal and a signal output terminal, and is configured to output a signal of the first clock signal terminal to the signal output terminal under the control of the pull-up node;

the pull-up node control circuit is connected to the pull-up node, a second clock signal terminal, a third clock signal terminal and a first voltage terminal, and is configured to provide a signal of the first voltage terminal to the pull-up node under the control of the second clock signal terminal and the third clock signal terminal;

wherein the pull-up node control circuit comprises a third transistor and a fourth transistor, wherein the third transistor has a gate electrode connected to the second clock signal terminal, a first electrode connected to the pull-up node, and a second electrode connected to a first electrode of the fourth transistor, and the fourth transistor has a gate electrode connected to the third clock signal terminal, and a second electrode connected to the first voltage terminal.

* * * * *